US007691664B2

(12) United States Patent
Kodas et al.

(10) Patent No.: US 7,691,664 B2
(45) Date of Patent: *Apr. 6, 2010

(54) LOW VISCOSITY PRECURSOR COMPOSITIONS AND METHODS FOR THE DEPOSITION OF CONDUCTIVE ELECTRONIC FEATURES

(75) Inventors: Toivo T. Kodas, Albuquerque, NM (US); Mark J. Hampden-Smith, Albuquerque, NM (US); Karel Vanheusden, Los Altos, CA (US); Hugh Denham, Albuquerque, NM (US); Aaron D. Stump, Albuquerque, NM (US); Allen B. Schult, Albuquerque, NM (US); Paolina Atanassova, Albuquerque, NM (US); Klaus Kunze, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 48 days.

This patent is subject to a terminal disclaimer.

(21) Appl. No.: 11/642,664

(22) Filed: Dec. 21, 2006

(65) Prior Publication Data

US 2008/0108218 A1   May 8, 2008

Related U.S. Application Data

(63) Continuation of application No. 10/265,351, filed on Oct. 4, 2002, now abandoned.

(60) Provisional application No. 60/327,620, filed on Oct. 5, 2001.

(51) Int. Cl.
*H01L 21/00* (2006.01)

(52) U.S. Cl. .................. 438/89; 438/584; 257/E25.009

(58) Field of Classification Search .................. 438/95, 438/97, 584, 66, 89; 257/E25.009, E31.058, 257/E31.115, E21.502; 136/243–252
See application file for complete search history.

(56) References Cited

U.S. PATENT DOCUMENTS

| 5,132,248 | A | | 7/1992 | Drummond et al. | |
| 5,393,695 | A | | 2/1995 | Takehara | |
| 5,985,691 | A | * | 11/1999 | Basol et al. | 438/95 |
| 6,075,203 | A | * | 6/2000 | Wang et al. | 136/256 |
| 6,350,946 | B1 | * | 2/2002 | Miyake et al. | 136/252 |
| 6,830,778 | B1 | | 12/2004 | Schulz et al. | |
| 6,971,742 | B2 | | 12/2005 | Nelson | |
| 7,098,163 | B2 | | 8/2006 | Hampden-Smith | |
| 2003/0108664 | A1 | | 6/2003 | Kodas et al. | |
| 2003/0148024 | A1 | | 8/2003 | Kodas et al. | |
| 2003/0175411 | A1 | | 9/2003 | Kodas | |
| 2003/0180451 | A1 | | 9/2003 | Kodas | |
| 2004/0023019 | A1 | | 2/2004 | Vandenberg et al. | |
| 2004/0063326 | A1 | | 4/2004 | Szlufcik et al. | |
| 2004/0151978 | A1 | | 8/2004 | Huang | |
| 2004/0231758 | A1 | | 11/2004 | Hampden-Smith et al. | |
| 2004/0242019 | A1 | | 12/2004 | Klein et al. | |
| 2005/0015175 | A1 | | 1/2005 | Huang | |
| 2005/0022862 | A1 | | 2/2005 | Cudzinovic et al. | |
| 2005/0061107 | A1 | | 3/2005 | Hampden-Smith et al. | |
| 2005/0153078 | A1 | | 7/2005 | Bentley et al. | |
| 2006/0001726 | A1 | | 1/2006 | Kodas | |
| 2006/0118759 | A1 | | 6/2006 | Klein et al. | |
| 2006/0213870 | A1 | | 9/2006 | Waldrop et al. | |
| 2006/0231802 | A1 | | 10/2006 | Konno | |
| 2006/0231803 | A1 | | 10/2006 | Wang et al. | |
| 2006/0269824 | A1 | | 11/2006 | Hampden-Smith | |
| 2006/0289055 | A1 | | 12/2006 | Sridharan et al. | |
| 2006/0292434 | A1 | | 12/2006 | Hampden-Smith | |
| 2007/0045594 | A1 | | 3/2007 | Taira | |
| 2007/0096062 | A1 | | 5/2007 | Kodas | |
| 2007/0096063 | A1 | | 5/2007 | Kodas | |
| 2007/0096064 | A1 | | 5/2007 | Kodas | |
| 2007/0096065 | A1 | | 5/2007 | Kodas | |
| 2007/0099330 | A1 | | 5/2007 | Kodas | |
| 2007/0102677 | A1 | | 5/2007 | Kodas | |
| 2007/0102678 | A1 | | 5/2007 | Kodas | |
| 2007/0102679 | A1 | | 5/2007 | Kodas | |
| 2007/0102680 | A1 | | 5/2007 | Kodas | |
| 2007/0102681 | A1 | | 5/2007 | Kodas | |
| 2007/0102682 | A1 | | 5/2007 | Kodas | |
| 2007/0102683 | A1 | | 5/2007 | Kodas | |
| 2007/0102684 | A1 | | 5/2007 | Kodas | |
| 2007/0102685 | A1 | | 5/2007 | Kodas | |
| 2007/0104869 | A1 | | 5/2007 | Kodas | |
| 2007/0104870 | A1 | | 5/2007 | Kodas | |

(Continued)

FOREIGN PATENT DOCUMENTS

EP    1 378 947 A1    1/2004

(Continued)

OTHER PUBLICATIONS

Ink Jet 2007 Technology Suppliers Showcase, Barcelona, Spain (May 30, 2007-Jun. 1, 2007).

(Continued)

*Primary Examiner*—Brook Kebede

(57) ABSTRACT

A precursor composition for the deposition and formation of an electrical feature such as a conductive feature. The precursor composition advantageously has a low viscosity enabling deposition using direct-write tools. The precursor composition also has a low conversion temperature, enabling the deposition and conversion to an electrical feature on low temperature substrates. A particularly preferred precursor composition includes silver metal for the formation of highly conductive silver features.

1 Claim, No Drawings

U.S. PATENT DOCUMENTS

| | | |
|---|---|---|
| 2007/0104875 A1 | 5/2007 | Kodas |
| 2007/0104876 A1 | 5/2007 | Kodas |
| 2007/0104879 A1 | 5/2007 | Kodas |
| 2007/0104880 A1 | 5/2007 | Kodas |
| 2007/0104881 A1 | 5/2007 | Kodas |
| 2007/0104882 A1 | 5/2007 | Kodas |
| 2007/0104883 A1 | 5/2007 | Kodas |
| 2007/0120096 A1 | 5/2007 | Kodas |
| 2007/0120097 A1 | 5/2007 | Kodas |
| 2007/0120098 A1 | 5/2007 | Kodas |
| 2007/0120099 A1 | 5/2007 | Kodas |
| 2007/0125989 A1 | 6/2007 | Kodas |
| 2007/0181844 A1 | 8/2007 | Kodas |
| 2007/0207565 A1 | 9/2007 | Kodas |
| 2007/0221887 A1 | 9/2007 | Kodas |
| 2008/0093422 A1 | 4/2008 | Kodas |
| 2008/0093423 A1 | 4/2008 | Kodas |
| 2008/0108218 A1 | 5/2008 | Kodas |

FOREIGN PATENT DOCUMENTS

| | | |
|---|---|---|
| EP | 1 066 416 B1 | 8/2005 |
| EP | 1 335 806 B1 | 6/2006 |
| WO | WO 00/43573 A1 | 7/2000 |
| WO | WO 01/53007 A1 | 7/2001 |
| WO | WO 01/54203 A2 | 7/2001 |
| WO | WO 01/83964 A1 | 11/2001 |
| WO | WO 02/34435 A1 | 5/2002 |
| WO | WO 2005/012212 A2 | 2/2005 |
| WO | WO 2005/012212 A3 | 2/2005 |

OTHER PUBLICATIONS

Kodas, Toivo, et al., "Tape Compositions for the Deposition of Electronic Features", U.S. Appl. No. 10/274,495 filed Oct. 18, 2002.

* cited by examiner

LOW VISCOSITY PRECURSOR COMPOSITIONS AND METHODS FOR THE DEPOSITION OF CONDUCTIVE ELECTRONIC FEATURES

CROSS-REFERENCE TO RELATED APPLICATIONS

This application is a continuation application of U.S. patent application Ser. No. 10/265,351, filed Oct. 4, 2002, which claims the benefit of U.S. Provisional Application No. 60/327,620 filed Oct. 5, 2001. Each of the foregoing referenced patent applications is incorporated by reference herein as if set forth below in its entirety.

BACKGROUND OF THE INVENTION

1. Field of the Invention

The present invention relates to precursor compositions that are useful for the deposition of conductive electronic features. The precursor compositions can advantageously have a low conversion temperature to enable low-temperature treatment of the precursors to form conductive electronic features on a variety of substrates. The precursor compositions can also have a low viscosity to enable the deposition of the compositions using direct-write tools, such as ink-jet devices.

2. Description of Related Art

The electronics, display and energy industries rely on the formation of coatings and patterns of conductive materials to form circuits on organic and inorganic substrates. The primary methods for generating these patterns are screen printing for features larger than about 100 µm and thin film and etching methods for features smaller than about 100 µm. Other subtractive methods to attain fine feature sizes include the use of photo-patternable pastes and laser trimming.

One consideration with respect to patterning of conductors is cost. Non-vacuum, additive methods generally entail lower costs than vacuum and subtractive approaches. Some of these printing approaches utilize high viscosity flowable liquids. Screen-printing, for example, uses flowable mediums with viscosities of thousands of centipoise. At the other extreme, low viscosity compositions can be deposited by methods such as ink-jet printing. However, this latter family of low viscosity compositions is not as well developed as the high viscosity compositions.

Ink-jet printing of conductors has been explored, but the approaches to date have been inadequate for producing well-defined features with good electrical properties. For example, ink-jet printable conductor compositions have been described by R. W. Vest (Metallo-Organic Materials for Improved Thick Film Reliability, Nov. 1, 1980, Final Report, Contract #N00163-79-C-0352, National Avionic Center). The compositions disclosed by Vest included a precursor and a solvent for the precursor. These compositions were not designed for processing at low temperatures, and as a result the processing temperatures were relatively high, such as greater than 250° C.

U.S. Pat. Nos. 5,882,722 and 6,036,889 by Kydd disclose conductor precursor compositions that contain metallic particles, a precursor and a vehicle and are capable of forming conductors at low temperatures on organic substrates. However, the formulations have a relatively high viscosity and are not useful for alternative deposition methods such as ink-jet printing.

Attempts have also been made to produce metal-containing compositions at low temperatures by using a composition containing a polymer and a precursor to a metal. See, for example, U.S. Pat. No. 6,019,926 by Southward et al. However, the deposits were chosen for optical properties and were either not conductive or were poorly conductive.

U.S. Pat. Nos. 5,846,615 and 5,894,038, both by Sharma et al., disclose precursors to Au and Pd that have low reaction temperatures thereby conceptually enabling processing at low temperatures to form metals. It is disclosed that a variety of methods can be used to apply the precursors, including ink-jet printing and screen printing. However, the printing of these compositions is not disclosed in detail.

U.S. Pat. No. 5,332,646 by Wright et al. discloses a method of making colloidal palladium and/or platinum metal dispersions by reducing a palladium and/or platinum metal of a metallo-organic palladium and/or platinum metal salt which lacks halide functionality. However, formulations for depositing electronic features are not disclosed.

U.S. Pat. No. 5,176,744 by Muller discloses the use of Cu-formate precursor compositions for the direct laser writing of copper metal. The compositions include a crystallization inhibitor to prevent crystallization of copper formate during drying.

U.S. Pat. No. 5,997,044 by Behm et al. discloses a document, such as a lottery ticket, having simple circuitry deposited thereon. The circuitry can be formed from inks containing conductive carbon and other additives as well as metallic particles. It is disclosed that the inks can be deposited by methods such as gravure printing.

U.S. Pat. No. 6,238,734 by Senzaki et al. is directed to compositions for the chemical vapor deposition of mixed metal or metal compound layers. The method uses a solventless common ligand mixture of metals in a liquid state for deposition by direct liquid injection.

There exists a need for low viscosity precursor compositions for the fabrication of conductive features for use in electronics, displays, and other applications. Further, there is a need for precursor compositions that have low processing temperatures to allow deposition onto organic substrates and subsequent heat treatment. It would also be advantageous if the compositions could be deposited with a fine feature size, such as not greater than 100 µm, while still providing electronic features with adequate electrical and mechanical properties.

The ideal low viscosity precursor composition and its associated deposition technique for the fabrication of electronic features such as a conductor would combine a number of attributes. The conductive feature would have high conductivity, preferably close to that of a dense, pure metal. The processing temperature would be low enough to allow formation of conductors on a variety of organic substrates. The deposition technique would allow deposition onto surfaces that are non-planar (e.g., not flat). The conductive feature would have high resistance to electromigration, solder leaching and oxidation. The conductor would also have good adhesion to the substrate.

Further, there is a need for electronic circuit elements and complete electronic circuits fabricated on inexpensive, thin and/or flexible substrates, such as paper, using high volume printing techniques such as reel-to-reel printing. Recent developments in organic thin film transistor (TFT) technology and organic light emitting device (OLED) technology have accelerated the need for complimentary circuit elements that can be written directly onto low cost substrates. Such elements include conductive interconnects, electrodes, conductive contacts and via fills.

DESCRIPTION OF THE INVENTION

The present invention is directed to low viscosity precursor compositions that can be deposited onto a substrate using, for example, direct-write methods such as ink-jet deposition. The precursor compositions preferably have a low decomposition temperature, thereby enabling the formation of electronic features on a variety of substrates, including organic substrates. The precursor compositions can include various combinations of molecular metal precursors, solvents, micron-sized particles, nanoparticles, vehicles, reducing agents and other additives. The precursor compositions can advantageously include one or more conversion reaction inducing agents adapted to reduce the conversion temperature of the precursor composition. The precursor compositions can be deposited onto a substrate and reacted to form highly conductive electronic features having good electrical and mechanical properties.

The precursor compositions according to the present invention can be formulated to have a wide range of properties and a wide range of relative cost. For example, in high volume applications that do not require well-controlled properties, inexpensive precursor compositions can be deposited on cellulose-based materials, such as paper, to form simple disposable circuits.

On the other hand, the precursor compositions of the present invention can be utilized to form complex, high precision circuitry having good electrical properties. For example, the compositions and methods of the present invention can be utilized to form conductive features on a substrate, wherein the features have a feature size (i.e., average width of the smallest dimension) of not greater than about 200 micrometers ($\mu$m), more preferably not greater than about 100 $\mu$m, even more preferably not greater than about 75 $\mu$m, even more preferably not greater than about 50 $\mu$m and most preferably not greater than about 25 $\mu$m.

The conductive electronic features formed according to the present invention can have good electrical properties. For example, the conductive features according to the present invention can have a resistivity that is not greater than 20 times the resistivity of the bulk conductor, such as not greater than 10 times the resistivity of the bulk conductor, preferably not greater than 6 times the resistivity of the bulk conductor, more preferably not greater than 4 times the resistivity of the bulk conductor and even more preferably not greater than 2 times the resistivity of the bulk conductor.

The method for forming the electronic features according to the present invention can also use relatively low processing temperatures. In one embodiment, the conversion temperature is not greater than about 250° C., such as not greater than about 225° C., more preferably is not greater than about 200° C. and even more preferably is not greater than about 185° C. In certain embodiments, the conversion temperature can be not greater than about 150° C., such as not greater than about 125° C. and even not greater than about 100° C.

Definitions

As used herein, the term low viscosity precursor composition refers to a flowable composition that has a viscosity of not greater than about 1000 centipoise. According to one embodiment, the low viscosity precursor composition has a viscosity of not greater than about 500 centipoise, more preferably not greater than about 100 centipoise and even more preferably not greater than about 50 centipoise. As used herein, the viscosity is measured at a shear rate of about 132 Hz and under the relevant deposition conditions, particularly temperature. For example, some precursor compositions may be heated prior to deposition to reduce the viscosity.

As used herein, the term molecular metal precursor refers to a molecular compound that includes a metal atom. Examples include organometallics (molecules with carbon-metal bonds), metal organics (molecules containing organic ligands with metal bonds to other types of elements such as oxygen, nitrogen or sulfur) and inorganic compounds such as metal nitrates, metal halides and other metal salts.

The low viscosity precursor compositions in accordance with the present invention can also include particulates of a metal other material phases. The particulates can fall in two size ranges referred to herein as nanoparticles and micron-size particles. Nanoparticles have an average size of not greater than about 100 nanometers. Micron-size particles have an average particle size of greater than about 0.1 $\mu$m. Nanoparticles and micron-size particles are collectively referred to herein as particles or powders.

In addition, the low viscosity precursor compositions can include a solvent for the molecular metal precursor. A solvent is a chemical that is capable of dissolving at least a portion of the molecular metal precursor. The low viscosity precursor composition can also include a vehicle. As used herein, a vehicle is a flowable medium that facilitates deposition of the precursor composition, such as by imparting sufficient flow properties or supporting dispersed particles. As will be appreciated from the following discussion, the same chemical compound can have multiple functions in the precursor composition, such as one that is both a solvent and a vehicle.

Other chemicals, referred to herein simply as additives, can also be included in the low viscosity precursor compositions of the present invention. As is discussed below, such additives can include, but are not limited to, crystallization inhibitors, polymers, polymer precursors (oligomers or monomers), reducing agents, binders, dispersants, surfactants, humectants, defoamers and the like.

Precursor Compositions

As is discussed above, the low viscosity precursor compositions according to the present invention can optionally include particulates in the form of nanoparticles and/or micron-size particles.

Nanoparticles have an average size of not greater than about 100 nanometers, such as from about 10 to 80 nanometers. Particularly preferred for low viscosity precursor compositions are nanoparticles having an average size in the range of from about 25 to 75 nanometers.

Nanoparticles that are particularly preferred for use in the present invention are not substantially agglomerated. Preferred nanoparticle compositions include $Al_2O_3$, $CuO_x$, $SiO_2$ and $TiO_2$, conductive metal oxides such as $In_2O_3$, indium-tin oxide (ITO) and antimony-tin oxide (ATO), silver, palladium, copper, gold, platinum and nickel. Other useful nanoparticles of metal oxides include pyrogenous silica such as HS-5 or M5 or others (Cabot Corp., Boston, Mass.) and AEROSIL 200 or others (Degussa AG, Dusseldorf, Germany) or surface modified silica such as TS530 or TS720 (Cabot Corp., Boston, Mass.) and AEROSIL 380 (Degussa AG, Dusseldorf, Germany). In one embodiment of the present invention, the nanoparticles are composed of the same metal that is contained in the metal precursor compound, discussed below. Nanoparticles can be fabricated using a number of methods and one preferred method, referred to as the Polyol process, is disclosed in U.S. Pat. No. 4,539,041 by Figlarz et al., which is incorporated herein by reference in its entirety.

The precursor compositions according to the present invention can also include micron-size particles, having an average size of at least about 0.1 μm. Preferred compositions of micron-size particles are similar to the compositions described above with respect to nanoparticles. The particles are preferably spherical, such as those produced by spray pyrolysis. Particles in the form of flakes increase the viscosity of the precursor composition and are not amenable to deposition using tools having a restricted orifice size, such as an ink-jet device. When substantially spherical particles are described herein, the particle size refers to the particle diameter. In one preferred embodiment, the low viscosity precursor compositions according to the present invention do not include any particles in the form of flakes.

Generally, the volume median particle size of the micron-size particles utilized in the low viscosity precursor compositions according to the present invention is at least about 0.1 μm, such as at least about 0.3 μm. Further, the volume median particle size is preferably not greater than about 20 μm. For most applications, the volume median particle size is more preferably not greater than about 10 μm and even more preferably is not greater than about 5 μm. A particularly preferred median particle size for the micron-size particles is from about 0.3 μm to about 3 μm. According to one embodiment of the present invention, it is preferred that the volume median particle size of the micron-size particles is at least 10 times smaller than the orifice diameter in the tool using the composition, such as not greater than about 5 μm for an ink-jet head having a 50 μm orifice.

There are many difficulties typically associated with depositing low viscosity compositions containing particulates. If many of the particulates are too small in size (nanoparticles), the viscosity of the composition can be too high. At the other extreme, larger micron-size particles tend to settle quickly out of the liquid leading to a short shelf life for the suspensions. Larger particles and particle agglomerates also tend to clog the orifices of many direct-write tools such as syringes and ink-jets. Flakes do not flow as easily through narrow channels and therefore spherical particulates are preferred. However, spherical particles of many materials are not readily available. For these and other reasons, many electronic materials have not been readily deposited using such direct-write tools.

The micron-size particles that are useful in the precursor compositions of the present invention advantageously have settling velocities that correspond to relatively small particle sizes when measured by a sedimentation technique, corresponding to porous or hollow particles. There are numerous ways to measure and quantify particle size including by mass, volume and number. For the low viscosity compositions of the present invention, one of the most important aspects is that the particles do not settle rapidly and the means by which the particle size is measured and reported must be carefully interpreted in this context. The geometric sizes of the particles, as might be observed using a microscope, do not reflect that particles with the same size can have different densities and therefore significantly different settling velocities. Hollow or porous micron-size particles settle more slowly than dense particles. Similarly, optically determined particle sizes as from light scattering in liquids or gases also provide data that only reflect the geometric size of the particles and these measurements do not reflect that particles of the same size can have different densities. Any measurement that provides the actual physical size of the particles, such as optical techniques, can provide numbers that must be interpreted with caution. For example, the volume median diameter of particles determined from light scattering cannot easily be related to mass median diameter in the absence of information about the apparent density of the particles, such as whether they are hollow or porous and the extent of the porosity. Likewise, the particle size data determined from settling velocities can provide information about the settling behavior of the particles, but does not provide information about the true geometric particle size if the particles are hollow or porous.

However, the combination of size data measured from optically-based approaches and data measured from sedimentation velocity provides a measure of particle performance in low viscosity compositions, where control of the particle settling rate is crucial. A small size calculated from settling velocity of a dense particle along with a large geometric size is an indication of hollow or porous particles. It is preferred that the average size of the micron-size particles utilized in the precursor compositions of the present invention, as measured by sedimentation techniques corresponds to dense particles having a settling velocity corresponding to an average particle size of not greater than about 4 μm, more preferably not greater than about 1 μm, even more preferably not greater than about 0.5 μm and even more preferably not greater than about 0.1 μm.

Thus, the micron-size particles according to the present invention preferably include particles having a low settling rate as measured by settling techniques while having a larger size when measured by geometric techniques. One such geometric technique is to measure the particle size by light scattering using a MICROTRAC particle size analyzer (Honeywell Industrial Automation and Control, Fort Washington, Pa.), which yields a geometric (volume) average particle size.

It is desirable to maintain a substantially neutral buoyancy of the micron-size particles in the suspension while maintaining a relatively large physical size. The buoyancy is required for stability while the larger size maintains liquid properties, such as viscosity or light scattering ability, within useful ranges. Stated another way, it is often desirable to provide micron-size particles having a low settling velocity but at high loadings. The settling velocity of the particles is proportional to the apparent density of the particle ($\rho_p$) minus the density of the liquid ($\rho_L$). Ideally, the particles will have an apparent density that is approximately equal to the density of the liquid, which is typically about 1 g/cm$^3$ (e.g., the density of water). Since a typical metal has a theoretical density in the range of from about 6 to about 20 g/cm$^3$, it is preferable that the apparent density of such micron-size particles be a fraction of the theoretical density. According to one embodiment, the micron-size particles have an apparent density that is not greater than about 75 percent of the theoretical density for the particle, more preferably not greater than about 50 percent of the theoretical density.

One preferred method for obtaining a reduced apparent density of the micron-size particles according to the present invention is to produce particles having a hollow microstructure. That is, one preferred particle morphology is a particle comprised of a dense shell having an inner radius and an outer radius. Preferably, the shell has a high density and is substantially impermeable. For such a hollow particle, the equation representing the conditions for neutral buoyancy can be written:

$$r_2 = \left[\sqrt[3]{\frac{\rho_p}{\rho_p - 1}}\right] r_1$$

where:
r₁=inner radius
$\rho_L$=1 (water)
r₂=outer radius
$\rho_p$=theoretical density of the particle For example, if a hollow particle has an outer radius of 2 μm (4 μm diameter) and a density of 5 g/cm³, then the optimum average wall thickness would be about 0.15 μm for the particle to be neutrally buoyant in a liquid having a density of 1 g/cm³.

Although hollow micron-size particles can be preferred according to the present invention, it will be appreciated that other particle morphologies can be utilized while maintaining an apparent density within the desired range. For example, the particles could have a sufficient amount of closed porosity to yield a particle having an apparent density that is lower than the theoretical density. Open (surface) porosity can also decrease the apparent density if the surface tension of the liquid medium (the liquid precursor components) does not enable the liquid to substantially penetrate the surface pores. For example, supported electrocatalyst particles, such as those disclosed in U.S. Pat. No. 6,103,393 by Kodas et al., can have a high level of porosity and surface area.

Thus, the particles that are particularly useful in low viscosity precursor compositions according to the present invention have a low settling velocity in the liquid medium. The settling velocity according to Stokes Law can be defined as:

$$V = \frac{D_{st}^2 (\rho_s - \rho_l) g}{18 \eta}$$

where:
$D_{st}$=Stokes diameter
η=fluid viscosity
$\rho_s$=apparent density of the particle
$\rho_l$=density of the liquid
V=settling velocity
g=acceleration due to gravity Preferably, the average settling velocity of the particles is sufficiently low such that the precursor compositions have a useful shelf life without the necessity of mechanical mixing techniques. Thus, it is preferred that a large mass fraction of the particles, such as at least about 50 weight percent remains suspended in the liquid for at least 1 hour. Stated another way, the micron-size particles preferably have a settling velocity that is not greater than 50 percent, more preferably not greater than 20 percent, of a theoretically dense particle of the same composition. Further, the particles can be completely redispersed after settling, such as by mixing, to provide the same particle size distribution in suspension as measured before settling.

According to a preferred embodiment of the present invention, the particles (nanoparticles and micron-size particles) also have a narrow particle size distribution, such that the majority of particles are about the same size and so that there are a minimal number of large particles that can clog an orifice, such as an orifice in an ink-jet head. A narrow particle size distribution is particularly advantageous for direct-write applications due to reduced clogging of the orifice by large particles and due to the ability to form surface features having a fine line width, high resolution and high packing density. Preferably, at least about 70 volume percent and more preferably at least about 80 volume percent of the particles within the same size classification (nanoparticles or micron-size particles) are not larger than twice the average particle size. For example, when the average particle size of micron-size particles is about 2 μm, it is preferred that at least about 70 volume percent of the micron-size particles are not larger than 4 μm and it is more preferred that at least about 80 volume percent of the micron-size particles are not larger than 4 μm. Further, it is preferred that at least about 70 volume percent and more preferably at least about 80 volume percent of the particles are not larger than about 1.5 times the average particle size. Thus, when the average particle size of the micron-size particles is about 2 μm, it is preferred that at least about 70 volume percent of the micron-size particles are not larger than 3 μm and it is more preferred that at least about 80 volume percent of the micron-size particles are not larger than 3 μm.

It is known that micron-size particles and nanoparticles often form soft agglomerates as a result of their relatively high surface energies, as compared to larger particles. It is also known that such soft agglomerates may be dispersed easily by treatments such as exposure to ultrasound in a liquid medium, sieving, high shear mixing and 3-roll milling. The average particle size and particle size distributions described herein are measured by mixing samples of the powders in a liquid medium, such as water and a surfactant, and exposing the suspension to ultrasound through either an ultrasonic bath or horn. The ultrasonic treatment supplies sufficient energy to disperse the soft agglomerates into primary particles. The primary particle size and size distribution are then measured by light scattering in a MICROTRAC instrument. This provides a good measure of the useful dispersion characteristics of the powder because this simulates the dispersion of the particles in a liquid vehicle, such as an ink-jet suspension. Thus, the references to particle size herein refer to the primary particle size, such as after lightly dispersing soft agglomerates of the particles.

It is also possible to provide micron-size particles or nanoparticles having a bimodal particle size distribution. That is, the particles can have two distinct and different average particle sizes. Preferably, each of the distinct particle size distributions will meet the foregoing size distribution limitations. A bimodal or trimodal particle size distribution can advantageously enhance the packing efficiency of the particles when deposited according to the present invention. In one embodiment, the larger mode includes hollow or porous particles while the smaller mode includes dense particles. The two modes can include particles of different composition. In one embodiment, the two modes have average particle sizes at about 1 μm and 5 μm, and in another embodiment the average particle size of the 2 modes is about 0.5 μm and 2.5 μm. The bimodal particle size distribution can also be achieved using nanoparticles and in one embodiment the larger mode has an average particle size of from about 1 μm to 10 μm and the smaller mode has an average particle size of from about 10 to 100 nanometers.

The particles that are useful in precursor compositions according to the present invention also preferably have a high degree of purity and it is preferred that the particles include not greater than about 1.0 atomic percent impurities and more preferably not greater than about 0.1 atomic percent impurities and even more preferably not greater than about 0.01 atomic percent impurities. Impurities are those materials that are not intended in the final product (i.e., the conductive feature) and that negatively affect the properties of the final product. For many electronic applications, the most critical impurities to avoid are Na, K, Cl, S and F. As is discussed below, it will be appreciated that the particles can include composite particles having one or more second phases. Such second phases are not considered impurities.

The particles for use in the precursor compositions according to the present invention can also be coated particles wherein the particle includes a surface coating surrounding the particle core. Coatings can be generated on the particle surface by a number of different mechanisms. One preferred mechanism is spray pyrolysis. One or more coating precursors can vaporize and fuse to the hot particle surface and thermally react resulting in the formation of a thin film coating by chemical vapor deposition (CVD). Preferred coatings deposited by CVD include metal oxides and elemental metals. Further, the coating can be formed by physical vapor deposition (PVD) wherein a coating material physically deposits on the surface of the particles. Preferred coatings deposited by PVD include organic materials and elemental metals. Alternatively, a gaseous precursor can react in the gas phase forming small particles, for example, less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions, such as temperature, precursor partial pressure, water partial pressure and the concentration of particles in the gas stream. Another possible surface coating method is surface conversion of the particles by reaction with a vapor phase reactant to convert the surface of the particles to a different material than that originally contained in the particles.

In addition, a volatile coating material such as lead oxide, molybdenum oxide or vanadium oxide can be introduced into the reactor such that the coating deposits on the particles by condensation. Further, the particles can be coated using other techniques. For example, soluble precursors to both the particle and the coating can be used in the precursor solution. In another embodiment, a colloidal precursor and a soluble precursor can be used to form a particulate colloidal coating on the composite particle. It will be appreciated that multiple coatings can be deposited on the surface of the particles if such multiple coatings are desirable.

The coatings are preferably as thin as possible while maintaining conformity about the particles such that the core of the particle is not substantially exposed. For example, the coatings on a micron-size particle can have an average thickness of not greater than about 200 nanometers, preferably not greater than about 100 nanometers and more preferably not more than about 50 nanometers. For most applications, the coating has an average thickness of at least about 5 nanometers. A specific example of useful coated particles is silica coated silver particles.

Nanoparticles can also be coated by utilizing the coating strategies as described above. In addition, it may be advantageous to coat nanoparticles with materials such as a polymer, to prevent agglomeration of the nanoparticles due to high surface energy. This is described by P.Y. Silvert et al. (Preparation of colloidal silver dispersions by the polyol process, Journal of Material Chemistry, 1997, volume 7(2), pp. 293-299). In another embodiment, the particles can be coated with an intrinsically conductive polymer, preventing agglomeration in the composition and providing a conductive patch after solidification of the composition. In yet another embodiment, the polymer can decompose during heating enabling the nanoparticles to sinter together. In one embodiment, the nanoparticles are generated in-situ and are coated with a polymer. Preferred coatings for nanoparticles according to the present invention include sulfonated perfluorohydrocarbon polymer (e.g., NAFION, available from E.I. duPont deNemours, Wilmington, Del.), polystyrene, polystyrene/methacrylate, polyvinyl pyrolidone, sodium bis(2-ethylhexyl) sulfosuccinate, tetra-n-octyl-ammonium bromide and alkane thiolates.

The particles that are useful with the present invention can also be "capped" with other compounds. The term capped refers to having compounds bonded to the outer surface of the particles without necessarily creating a coating over the outer surface. The particles used with the present invention can be capped with any functional group including organic compounds such as polymers, organometallic compounds, and metal organic compounds. These capping agents can serve a variety of functions including the prevention of agglomeration of the particles, prevention of oxidation, enhancement of bonding of the particles to a surface, and enhancement of the flowability of the particles in a precursor composition. Preferred capping agents that are useful with the particles of the present invention include amine compounds, organometallic compounds, and metal organic compounds.

The particulates in accordance with the present invention can also be composite particles wherein the particles include a first phase and a second phase associated with the first phase. Preferred composite particulates include carbon-metal, carbon-polymer, carbon-ceramic, carbon1-carbon2, ceramic-ceramic, ceramic-metal, metal1-metal2, metal-polymer, ceramic-polymer, and polymer1-polymer2. Also preferred are certain 3-phase combinations such as metal-carbon-polymer. In one embodiment, the second phase is uniformly dispersed throughout the first phase. The second phase can be an electronic compound or it can be a non-electronic compound. For example, sintering inhibitors such as metal oxides can be included as a second phase in a first phase of a metallic material, such as silver metal to inhibit sintering of the metal without substantially affecting the conductivity.

As a further example, the particles can be electrocatalyst particles, such as those composed of a metal or a metal oxide dispersed on a support such as carbon. Such particles are disclosed in U.S. Pat. No. 6,103,393 by Kodas et al., which is incorporated herein by reference in its entirety. Such particles can be used in fuel cells such as direct methanol fuel cells (DMFC) and proton exchange membrane fuel cells (PEMFC), as well as metal-air batteries and similar devices.

Further, the micron-size particles can be hollow particles, as is discussed above, wherein the shell includes a first phase and a second phase dispersed throughout the first phase.

The particulates according to a preferred embodiment of the present invention are also substantially spherical in shape. That is, the particulates are not jagged or irregular in shape. Spherical particles are particularly advantageous because they are able to disperse more readily in a liquid suspension and impart advantageous flow characteristics to the precursor composition, particularly for deposition using an ink-jet device or similar tool. For a given level of solids loading, a low viscosity precursor composition having spherical particles will have a lower viscosity than a composition having non-spherical particles, such as flakes. Spherical particles are also less abrasive than jagged or plate-like particles, reducing the amount of abrasion and wear on the deposition tool.

Thus, micron-size particles with low settling densities derived from their porosity or hollowness can be used to provide the low viscosity precursor compositions. Such micron-size particles can be produced, for example, by spray pyrolysis. Spray pyrolysis for production of micron-size particles is described in U.S. Pat. No. 6,103,393 by Kodas, et al., which is incorporated herein by reference in its entirety.

Hollow particles with well-controlled apparent density can advantageously be formed by the spray-pyrolysis process disclosed above. In the case of metals such as silver, it is often necessary to add small amounts of metal oxide precursors, or salts to the starting solution that can be removed after particle formation. The metal oxides or the salts inhibit the densification of the metal particles during the residence time in the reactor. As an example, porous and/or hollow particles of conductors with reduced density can be formed by adding metal oxide precursors such as alumina, silica, copper oxides, glasses (e.g., barium aluminum borosilicate, calcium silicate or lead borosilicate) and virtually any other metal oxide that has a melting point significantly greater than the metal. These additives can also serve the dual purpose of providing adhesion to substrates, inhibiting sintering (as in the case of silver that has a low sintering temperature), modifying temperature coefficients of resistivity and other functions.

Another method for providing hollow particles in a spray pyrolysis process is the use of particle precursors having low solubility. Precursors having a low solubility precipitate at the surface of the droplet thereby forming a shell. As the remainder of the solvent leaves, more metal precursor precipitates onto the shell, forming a hollow particle. Examples include organometallics, metal organics and inorganic precursors. Preferred particle precursors according to this embodiment have solubilities of not greater than about 20 wt. %, more preferably not greater than about 10 wt. % and even more preferably not greater than about 5 wt. %. Inorganic precursors can be selected, for example, from metal nitrates, metal halides, metal sulfates, metal hydroxides and metal carbonates.

Another method for forming hollow particles is to use particle precursors that have low effective yields during conversion from the precursor to the particulate product. Once the droplets are dried and the particles consist only of precursor, reaction to form the product results in a porous or hollow particle because of the large volume change from reactant to product with a relatively constant particle diameter. One example is the formation of alumina from aluminum nitrate. Preferred particle precursors according to this embodiment have a volumetric yield of not greater than about 50%, more preferably not greater than about 25% and even more preferably not greater than about 10%.

Another method is to use particle precursors that liberate gases and inflate the particles during reaction of the precursor. Preferred particle precursors according to this embodiment release, for example, $NO_x$ or $CO_2$ gas.

Metal salts such as nitrates, chlorides, sulfates, hydroxides or oxalates can be used as particle precursors in a spray pyrolysis process. Preferred metal salts include the metal nitrates. For example, a preferred precursor to platinum metal according to the present invention is nitrated diammine dinitroplatinum (II). Another preferred metal is silver and a preferred precursor to silver metal particles is silver nitrate, $AgNO_3$, or a silver carboxylate compound.

The precursor compositions according to the present invention can also include molecular metal precursors, either alone or in combination with particulates. Preferred examples include molecular metal precursors to silver (Ag), nickel (Ni), platinum (Pt), gold (Au), palladium (Pd), copper (Cu), indium (In) and tin (Sn). Other molecular metal precursors can include precursors to aluminum (Al), zinc (Zn), iron (Fe), tungsten (W), molybdenum (Mo), ruthenium (Ru), lead (Pb), bismuth (Bi) and similar metals. The molecular metal precursors can be either soluble or insoluble in the precursor composition.

In general, molecular metal precursor compounds that eliminate ligands by a radical mechanism upon conversion to metal are preferred, especially if the species formed are stable radicals and therefore lower the decomposition temperature of that precursor compound.

Furthermore, molecular metal precursors containing ligands that eliminate cleanly upon precursor conversion and escape completely from the substrate (or the formed functional structure) are preferred because they are not susceptible to carbon contamination or contamination by anionic species such as nitrates. Therefore, preferred precursors for metals used for conductors are carboxylates, alkoxides or combinations thereof that would convert to metals, metal oxides or mixed metal oxides by eliminating small molecules such as carboxylic acid anhydrides, ethers or esters. Metal carboxylates, particularly halogenocarboxylates such as fluorocarboxylates, are particularly preferred metal precursors due to their high solubility.

Particularly preferred metal precursor compounds are metal precursor compounds containing silver, nickel, platinum, gold, palladium, copper and ruthenium.

Examples of silver metal precursors that can be used in the low viscosity precursor compositions according to the present invention are illustrated in Table 1.

TABLE 1

Silver Precursor Molecular Compounds and Salts

| General Class | Examples | Chemical Formula |
|---|---|---|
| Nitrates | Silver nitrate | $AgNO_3$ |
| Nitrites | Silver nitrite | $AgNO_2$ |
| Oxides | Silver oxide | $Ag_2O, AgO$ |
| Carbonates | Silver carbonate | $Ag_2CO_3$ |
| Oxalates | Silver oxalate | $Ag_2C_2O_4$ |
| (Pyrazolyl)borates | Silver trispyrazolylborate | $Ag[(N_2C_3H_3)_3]BH$ |
| | Silver tris(dimethylpyrazolyl)borate | $Ag[((CH_3)_2N_2C_3H_3)_3]BH$ |
| Azides | Silver azide | $AgN_3$ |
| Fluoroborates | Silver tetrafluoroborate | $AgBF_4$ |
| Carboxylates | Silver acetate | $AgO_2CCH_3$ |
| | Silver propionate | $AgO_2CC_2H_5$ |
| | Silver butanoate | $AgO_2CC_3H_7$ |
| | Silver ethylbutyrate | $AgO_2CCH(C_2H_5)C_2H_5$ |
| | Silver pivalate | $AgO_2CC(CH_3)_3$ |

TABLE 1-continued

Silver Precursor Molecular Compounds and Salts

| General Class | Examples | Chemical Formula |
|---|---|---|
| | Silver cyclohexanebutyrate | $AgO_2C(CH_2)_3C_6H_{11}$ |
| | Silver ethylhexanoate | $AgO_2CCH(C_2H_5)C_4H_9$ |
| | Silver neodecanoate | $AgO_2CC_9H_{19}$ |
| Halogenocarboxylates | Silver trifluoroacetate | $AgO_2CCF_3$ |
| | Silver pentafluoropropionate | $AgO_2CC_2F_5$ |
| | Silver heptafluorobutyrate | $AgO_2CC_3F_7$ |
| | Silver trichloroacetate | $AgO_2CCCl_3$ |
| | Silver 6,6,7,7,8,8,8-heptafluoro-2,2-dimethyl-3,5-octanedionate | AgFOD |
| Hydroxycarboxylates | Silver lactate | $AgO_2CH(OH)CH_3$ |
| | Silver citrate | $Ag_3C_6H_5O_7$ |
| | Silver glycolate | $AgOOCCH(OH)CH_3$ |
| Aminocarboxylates | Silver glyconate | |
| Aromatic and nitro and/or | Silver benzoate | $AgO_2CCH_2C_6H_5$ |
| fluoro substituted aromatic | Silver phenylacetate | $AgOOCCH_2C_6H_5$ |
| Carboxylates | Silver nitrophenylacetates | $AgOOCCH_2C_6H_4NO_2$ |
| | Silver dinitrophenylacetate | $AgOOCCH_2C_6H_3(NO_2)_2$ |
| | Silver difluorophenylacetate | $AgOOCCH_2C_6H_3F_2$ |
| | Silver 2-fluoro-5-nitrobenzoate | $AgOOCC_6H_3(NO_2)F$ |
| Beta diketonates | Silver acetylacetonate | $Ag[CH_3COCH=C(O-)CH_3]$ |
| | Silver hexafluoroacetylacetonate | $Ag[CF_3COCH=C(O-)CF_3]$ |
| | Silver trifluoroacetylacetonate | $Ag[CH_3COCH=C(O-)CF_3]$ |
| Silver sulfonates | Silver tosylate | $AgO_3SC_6H_4CH_3$ |
| | Silver triflate | $AgO_3SCF_3$ |

In addition to the foregoing, complex silver salts containing neutral inorganic or organic ligands can also be used as precursors. These salts are usually in the form of nitrates, halides, perchlorates, hydroxides or tetrafluoroborates. Examples are listed in Table 2.

TABLE 2

Complex Silver Salt Precursors

| Class | Examples (Cation) |
|---|---|
| Amines | $[Ag(RNH_2)_2]^+$, $Ag(R_2NH)_2]^+$, $[Ag(R_3N)_2]^+$, R = aliphatic or aromatic |
| N-Heterocycles | $[Ag(L)_x]^+$, (L = aziridine, pyrrol, indol, piperidine, pyridine, aliphatic substituted and amino substituted pyridines, imidazole, pyrimidine, piperazine, triazoles, etc.) |
| Amino alcohols | $[Ag(L)_x]^+$, L = Ethanolamine |
| Amino acids | $[Ag(L)_x]^+$, L = Glycine |
| Acid amides | $[Ag(L)_x]^+$, L = Formamides, acetamides |
| Nitriles | $[Ag(L)_x]^+$, L = Acetonitriles |

The molecular metal precursors can be utilized in an aqueous-based solvent or an organic solvent. Organic solvents are typically used for ink-jet deposition. Preferred molecular metal precursors for silver in an organic solvent include Ag-nitrate, Ag-neodecanoate, Ag-trifluoroacetate, Ag-acetate, Ag-lactate, Ag-cyclohexanebutyrate, Ag-carbonate, Ag-oxide, Ag-ethylhexanoate, Ag-acetylacetonate, Ag-ethylbutyrate, Ag-pentafluoropropionate, Ag-benzoate, Ag-citrate, Ag-heptafluorobutyrate, Ag-salicylate, Ag-decanoate and Ag-glycolate. Among the foregoing, particularly preferred molecular metal precursors for silver include Ag-acetate, Ag-nitrate, Ag-trifluoroacetate and Ag-neodecanoate. Most preferred among the foregoing silver precursors are Ag-trifluoroacetate and Ag-acetate. The preferred precursors generally have a high solubility and high metal yield. For example, Ag-trifluoroacetate has a solubility in dimethylacetamide (DMAc) of about 78 wt. % and Ag-trifluoroacetate is a particularly preferred silver precursor according to the present invention.

Preferred molecular silver precursors for aqueous-based solvents include Ag-nitrates, Ag-fluorides such as silver fluoride or silver hydrogen fluoride ($AgHF_2$), Ag-thiosulfate, Ag-trifluoroacetate and soluble diammine complexes of silver salts.

Silver precursors in solid form that decompose at a low temperature, such as not greater than about 200° C., can also be used. Examples include Ag-oxide, Ag-nitrite, Ag-carbonate, Ag-lactate, Ag-sulfite and Ag-citrate.

When a more volatile molecular silver precursor is desired, such as for spray deposition of the precursor composition, the precursor can be selected from alkene silver betadiketonates, $R_2(CH)_2Ag([R'COCH=C(O-)CR'']$ where R=methyl or ethyl and R', R''=$CF_3$, $C_2F_5$, $C_3F_7$, $CH_3$, $C_mH_{2m+1}$ (m=2 to 4), or trialkylphosphine and triarylphosphine derivatives of silver carboxylates, silver beta diketonates or silver cyclopentadienides.

Molecular metal precursors for nickel that are preferred according to the present invention are illustrated in Table 3. A particularly preferred nickel precursor for use with an aqueous-based solvent is Ni-acetylacetonate.

TABLE 3

Molecular Metal Precursors for Nickel

| General Class | Example | Chemical Formula |
|---|---|---|
| Inorganic Salts | Ni-nitrate | $Ni(NO_3)_2$ |
| | Ni-sulfate | $NiSO_4$ |

TABLE 3-continued

Molecular Metal Precursors for Nickel

| General Class | Example | Chemical Formula |
|---|---|---|
| | Nickel ammine complexes | $[Ni(NH_3)_6]^{n+}$ (n = 2, 3) |
| | Ni-tetrafluoroborate | $Ni(BF_4)_2$ |
| Metal Organics | Ni-oxalate | $NiC_2O_4$ |
| (Alkoxides, Beta-diketonates, | Ni-isopropoxide | $Ni(OC_3H_7)_2$ |
| Carboxylates, | Ni-methoxyethoxide | $Ni(OCH_2CH_2OCH_3)_2$ |
| Fluorocarboxylates | Ni-acetylacetonate | $[Ni(acac)_2]_3$ or $Ni(acac)_2(H_2O)_2$ |
| | Ni-hexafluoroacetylacetonate | $Ni[CF_3COCH{=}C(O{-})CF_3]_2$ |
| | Ni-formate | $Ni(O_2CH)_2$ |
| | Ni-acetate | $Ni(O_2CCH_3)_2$ |
| | Ni-octanoate | $Ni(O_2CC_7H_{15})_2$ |
| | Ni-ethylhexanoate | $Ni(O_2CCH(C_2H_5)C_4H_9)_2$ |
| | Ni-trifluoroacetate | $Ni(OOCCF_3)_2$ |

Various molecular precursors can be used for platinum metal. Preferred molecular precursors include ammonium salts of platinates such as ammonium hexachloro platinate $(NH_4)_2PtCl_6$, and ammonium tetrachloro platinate $(NH_4)_2PtCl_4$; sodium and potassium salts of halogeno, pseudohalogeno or nitrito platinates such as potassium hexachloro platinate $K_2PtCl_6$, sodium tetrachloro platinate $Na_2PtCl_4$, potassium hexabromo platinate $K_2PtBr_6$, potassium tetranitrito platinate $K_2Pt(NO_2)_4$; dihydrogen salts of hydroxo or halogeno platinates such as hexachloro platinic acid $H_2PtCl_6$, hexabromo platinic acid $H_2PtBr_6$, dihydrogen hexahydroxo platinate $H_2Pt(OH)_6$; diammine and tetraammine platinum compounds such as diammine platinum chloride $Pt(NH_3)_2Cl_2$, tetraammine platinum chloride $[Pt(NH_3)_4]Cl_2$, tetraammine platinum hydroxide $[Pt(NH_3)_4](OH)_2$, tetraammine platinum nitrite $[Pt(NH_3)_4](NO_2)_2$, tetraammine platinum nitrate $Pt(NH_3)_4(NO_3)_2$, tetraammine platinum bicarbonate $[Pt(NH_3)_4](HCO_3)_2$, tetraammine platinum tetrachloroplatinate $[Pt(NH_3)_4]PtCl_4$; platinum diketonates such as platinum (II) 2,4-pentanedionate $Pt(C_5H_7O_2)_2$; platinum nitrates such as dihydrogen hexahydroxo platinate $H_2Pt(OH)_6$ acidified with nitric acid; other platinum salts such as Pt-sulfite and Pt-oxalate; and platinum salts comprising other N-donor ligands such as $[Pt(CN)_6]^{4+}$.

Platinum precursors useful in organic-based precursor compositions include Pt-carboxylates or mixed carboxylates. Examples of carboxylates include Pt-formate, Pt-acetate, Pt-propionate, Pt-benzoate, Pt-stearate, Pt-neodecanoate. Other precursors useful in organic vehicles include aminoorgano platinum compounds including Pt(diaminopropane)(ethylhexanoate).

Preferred combinations of platinum precursors and solvents include: $PtCl_4$ in $H_2O$; Pt-nitrate solution from $H_2Pt(OH)_6$; $H_2Pt(OH)_6$ in $H_2O$; $H_2PtCl_6$ in $H_2O$; and $[Pt(NH_3)_4](NO_3)_2$ in $H_2O$.

Gold precursors that are particularly useful for aqueous based precursor compositions include Au-chloride ($AuCl_3$) and tetrachloric auric acid ($HAuCl_4$).

Gold precursors useful for organic based formulations include: Au-thiolates, Au-carboxylates such as Au-acetate $Au(O_2CCH_3)_3$; aminoorgano gold carboxylates such as imidazole gold ethylhexanoate; mixed gold carboxylates such as gold hydroxide acetate isobutyrate; Au-thiocarboxylates and Au-dithiocarboxylates.

In general, preferred gold molecular metal precursors for low temperature conversion are compounds comprising a set of different ligands such as mixed carboxylates or mixed alkoxo metal carboxylates. As one example, gold acetate isobutyrate hydroxide decomposes at 155° C., a lower temperature than gold acetate. As another example, gold acetate neodecanoate hydroxide decomposes to gold metal at even lower temperature, 125° C. Still other examples can be selected from gold acetate trifluoroacetate hydroxide, gold bis(trifluoroacetate) hydroxide and gold acetate pivalate hydroxide.

Other useful gold precursors include Au-azide and Au-isocyanide. When a more volatile molecular gold precursor is desired, such as for spray deposition, the precursor can be selected from:

dialkyl and monoalkyl gold carboxylates, $R_{3-n}Au(O_2CR')_n$ (n=1,2) R=methyl, ethyl; R'=$CF_3$, $C_2F_5$, $C_3F_7$, $CH_3$, $C_mH_{2m+1}$ (m=2-9)

dialkyl and monoalkyl gold beta diketonates, $R_{3-n}Au[R'COCH{=}C(O{-})CR'']_n$ (n=1,2), R=methyl, ethyl; R', R''=$CF_3$, $C_2F_5$, $C_3F_7$, $CH_3$, $C_mH_{2m+1}$ (m=2-4)

dialkyl and monoalkyl gold alkoxides, $R_{3-n}Au(OR')_n$ (n=1,2) R=methyl, ethyl; R'=$CF_3$, $C_2F_5$, $C_3F_7$, $CH_3$, $C_mH_{2m+1}$ (m=2-4), $SiR_3''$ (R''=methyl, ethyl, propyl, isopropyl, n-butyl, isobutyl, tert. Butyl)

phosphine gold complexes:

$RAu(PR'_3)R$, R'=methyl, ethyl, propyl, isopropyl, n-butyl, isobutyl, tert. butyl., $R_3Au(PR'_3)R$, R'=methyl, ethyl, propyl, isopropyl, n-butyl, isobutyl, tert. butyl.

Particularly useful molecular precursors to palladium for organic based precursor, compositions according to the present invention include Pd-carboxylates, including Pd-fluorocarboxylates such as Pd-acetate, Pd-propionate, Pd-ethylhexanoate, Pd-neodecanoate and Pd-trifluoroacetate as well as mixed carboxylates such as Pd(OOCH)(OAc), Pd(OAc)(ethylhexanoate); Pd(ethylhexanoate)$_2$, Pd(OOCH)$_{1.5}$ (ethylhexanoate)$_{0.5}$, Pd(OOCH)(ethylhexanoate), Pd(OOCCH(OH)CH(OH)COOH)$_m$ (ethylhexanoate), Pd(OPr)$_2$, Pd(OAc)(OPr), Pd-oxalate, Pd(OOCCHO)$_m$ (OOCCH$_2$OH)$_n$=(Glyoxilic palladium glycolate) and Pd-alkoxides. A particularly preferred palladium precursor is Pd-trifluoroacetate.

Palladium precursors useful for aqueous based precursor compositions include: tetraammine palladium hydroxide [Pd(NH$_3$)$_4$](OH)$_2$; Pd-nitrate Pd(NO$_3$)$_2$; Pd-oxalate Pd(O$_2$CCO$_2$)$_2$; Pd-chloride PdCl$_2$; Di- and tetraammine palladium chlorides, hydroxides or nitrates such as tetraammine palladium chloride [Pd(NH$_3$)$_4$]Cl$_2$, tetraammine palladium hydroxide [Pd(NH$_3$)$_4$](OH)$_2$, tetraammine palladium nitrate [Pd(NH$_3$)$_4$](NO$_3$)$_2$, diammine palladium nitrate [Pd(NH$_3$)$_2$](NO$_3$)$_2$ and tetraammine palladium tetrachloropalladate [Pd(NH$_3$)$_4$][PdCl$_4$]

When selecting a molecular copper precursor compound, it is desired that the compound react during processing to metallic copper without the formation of copper oxide or other species that are detrimental to the conductivity of the conductive copper feature. Some copper molecular precursors form copper by thermal decomposition at elevated temperatures. Other molecular copper precursors require a reducing agent to convert to copper metal. Reducing agents are materials that are oxidized, thereby causing the reduction of another substance. The reducing agent loses one or more electrons and is referred to as having been oxidized. The introduction of the reducing agent can occur in the form of a chemical agent (e.g., formic acid) that is soluble in the precursor composition to afford a reduction to copper either during transport to the substrate or on the substrate. In some cases, the ligand of the molecular copper precursor has reducing characteristics, such as in Cu-formate or Cu-hypophosphite, leading to reduction to copper metal. However, formation of metallic copper or other undesired side reactions that occur prematurely in the ink or precursor composition should be avoided.

Accordingly, the ligand can be an important factor in the selection of suitable copper molecular precursors. During thermal decomposition or reduction of the precursor, the ligand needs to leave the system cleanly, preferably without the formation of carbon or other residues it could be incorporated into the copper feature. Copper precursors containing inorganic ligands are preferred in cases where carbon contamination is detrimental. Other desired characteristics for molecular copper precursors are low decomposition temperature or processing temperature for reduction to copper metal, high solubility in the selected solvent/vehicle to increase metallic yield and achieve dense features and the compound should be environmentally benign.

Preferred copper metal precursors according to the present invention include Cu-formate and Cu-neodecanoate. Molecular copper precursors that are useful for aqueous-based precursor compositions include: Cu-nitrate and ammine complexes thereof; Cu-carboxylates including Cu-formate and Cu-acetate; and Cu beta-diketonates such as Cu-hexafluoroacetylacetonate and copper salts such as Cu-chloride.

Molecular copper precursors generally useful for organic based formulations include: Cu-carboxylates and Cu-fluorocarboxylates, such as Cu-formate; Cu-ethylhexanoate; Cu-neodecanoate; Cu-methacrylate; Cu-trifluoroacetate; Cu-hexanoate; and copper beta-diketonates such as cyclooctadiene Cu hexafluoroacetylacetonate.

Among the foregoing, Cu-formate is particularly preferred as it is highly soluble in water and results in the in-situ formation of formic acid, which is an effective reducing agent.

Copper precursors useful in this invention can also be categorized as copper I and copper II compounds. They can be categorized as inorganic, metal organic, and organometallic. They can also be categorized as copper hydrides, copper amides, copper alkenes, copper allyls, copper carbonyls, copper metallocenes, copper cyclopentadienyls, copper arenes, copper carbonates, copper hydroxides, copper carboxylates, copper oxides, organo copper, copper beta-diketonates, copper alkoxides, copper beta-ketoiminates, copper halides, copper alkyls. The copper compounds can have neutral donor ligands or not have neutral ligands. Copper I compounds are particularly useful for disproportionation reactions. The disproportionation products are copper metal and a copper II compound. In some cases a neutral ligand is also a product.

In a novel approach, the copper II product can be rapidly converted back to a copper I compound using a reducing agent. Appropriate reducing agents for reducing copper II to copper I are known in the art. Useful reducing agents for copper precursors include ethylene diamine, tetramethylethylenediamine, 3 aminopropanol, mono, di and triethanolamine. Useful reducing agents are described in U.S. Pat. No. 5,378,508, which is incorporated herein by reference in its entirety. The resulting copper I compound reacts further via disproportionation to form more copper and copper II compound. Through this approach with excess reducing agent, copper I compounds can be used to form pure copper metal without any copper II compounds.

The copper compounds can also be used as capping agents to cap copper particles. The copper particles can be nanoparticles. U.S. Pat. No. 6,294,401 by Jacobsen describes capping procedures and is incorporated herein in its entirety by reference.

As is discussed above, two or more molecular metal precursors can be combined in the precursor composition to form metal alloys and/or metal compounds. For example, preferred combinations of metal precursors to form alloys based on silver include: Ag-nitrate and Pd-nitrate; Ag-acetate and [Pd(NH$_3$)$_4$](OH)$_2$; Ag-trifluoroacetate and [Pd(NH$_3$)$_4$](OH)$_2$; and Ag-neodecanoate and Pd-neodecanoate. One particularly preferred combination of molecular metal precursors is Ag-trifluoroacetate and Pd-trifluoroacetate. Another preferred alloy is Ag/Cu.

To form alloys, the two (or more) molecular metal precursors should have similar decomposition temperatures to avoid the formation of one of the metal species before the other species. Preferably, the decomposition temperatures of the different molecular metal precursors are within 50° C., more preferably within 25° C.

Some applications require the utilization of a transparent or semi-transparent conductive feature. For example, indium tin oxide (ITO) is useful for the formation of transparent conductive features, such as for use in display applications. Antimony tin oxide (ATO) is useful as a color tunable oxide layer that finds use in electrochromic applications.

Such transparent conductive features can also be fabricated according to the present invention. For ITO, useful molecular precursors for indium include: In-nitrate; In-chloride; In-carboxylates such as In-acetate; In-propionates including fluoro, chloro or bromo derivatives thereof; beta diketonates such as In-acetylacetonate, In-hexafluoroacetylacetonate and In-trifluoroacetylacetonate; pyrazolyl borohydrides such as In(pz)$_3$BH; In-alkoxides and In-fluoroalkoxides; and In-amides. Mixed alkoxo In-carboxylates such as indium isopropoxide ethylhexanoate are also useful.

Useful molecular precursors for tin in ITO or ATO include: Sn-halides such as Sn-tetrachloride; Sn-dichloride; Sn-carboxylates such as Sn-acetate or Sn-ethylhexanoate; Sn-alkoxides such as Sn(O$^t$Bu)$_4$; Sn-hydroxycarboxylates such as Sn-glycolate; and beta diketonates such as Sn-hexafluoroacetylacetonate.

Useful molecular precursors for antimony include: Sb-trichloride; antimony carboxylates such as Sb-acetate or Sb-neodecanoate; antimony alkoxides such as Sb-methoxide, Sb-ethoxide, Sb-butoxide.

The low viscosity precursor compositions according to the present invention preferably also include a solvent capable of solubilizing the molecular metal precursor discussed above. The solvent can be water thereby forming an aqueous-based precursor composition. Water is more environmentally acceptable than organic solvents. However, water cannot typically be used for deposition of the precursor composition onto hydrophobic substrates, such as tetrafluoroethylene fluorocarbon substrates (e.g., TEFLON, E.I. duPont deNemours, Wilmington, Del.) without modification of the substrate or the aqueous composition.

The solvent can also include an organic solvent, by itself or in addition to water. The selected solvent should be capable of solubilizing the selected molecular metal precursor to a high level. A low solubility of the molecular metal precursor in the solvent leads to low yields of the conductor, thin deposits and low conductivity. The precursor compositions of the present invention exploit combinations of solvents and precursors that advantageously provide high solubility of the molecular precursor while still allowing low temperature conversion of the precursor to the conductor.

According to one embodiment of the present invention, the solubility of the molecular metal precursor in the solvent is preferably at least about 20 weight percent metal precursor, more preferably at least 40 weight percent metal precursor, even more preferably at least about 50 weight percent metal precursor and most preferably at least about 60 weight percent metal precursor. Such high levels of metal precursor lead to increased metal yield and the ability to deposit features having adequate thickness.

The solvents can be polar or non-polar. Solvents that are useful according to the present invention include amines, amides, alcohols, water, ketones, unsaturated hydrocarbons, saturated hydrocarbons, mineral acids organic acids and bases, Preferred solvents include alcohols, amines, amides, water, ketone, ether, aldehydes and alkenes. Particularly preferred organic solvents according to the present invention include N,N,-dimethylacetamide (DMAc), diethyleneglycol butylether (DEGBE), ethanolamine and N-methyl pyrrolidone.

In some cases, the solvent can be a high melting point solvent, such as one having a melting point of at least about 30° C. and not greater than about 100° C. In this embodiment, a heated ink-jet head can be used to deposit the precursor composition while in a flowable state whereby the solvent solidifies upon contacting the substrate. Subsequent processing can then remove the solvent by other means and then convert the material to the final product, thereby retaining resolution. Preferred solvents according to this embodiment are waxes, high molecular weight fatty acids, alcohols, acetone, N-methyl-2-pyrrolidone, toluene, tetrahydrofuran and the like. Alternatively, the precursor composition may be a liquid at room temperature, wherein the substrate is kept at a lower temperature below the freezing point of the composition.

The solvent can also be a low melting point solvent. A low melting point is required when the precursor composition must remain as a liquid on the substrate until dried. A preferred low melting point solvent according to this embodiment is DMAc, which has a melting point of about −20° C.

In addition, the solvent can be a low vapor pressure solvent. A lower vapor pressure advantageously prolongs the work life of the composition in cases where evaporation in the ink-jet head, syringe or other tool leads to problems such as clogging. A preferred solvent according to this embodiment is terpineol. Other low vapor pressure solvents include diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows rapid removal of the solvent by drying. High vapor pressure solvents include acetone, tetrahydrofuran, toluene, xylene, ethanol, methanol, 2-butanone and water.

As is discussed above, a vehicle is a flowable medium that facilitates the deposition of the precursor composition. In cases where the liquid serves only to carry particles and not to dissolve molecular species, the terminology of vehicle is often used for the liquid. However, in many precursor compositions, the solvent can also be considered the vehicle. The metal, such as silver, can be bound to the vehicle, for example, by synthesizing a silver derivative of terpineol that simultaneously acts as both a precursor to silver and as a vehicle. This improves the metallic yield and reduces the porosity of the conductive feature.

Examples of preferred vehicles are listed in Table 4. Particularly preferred vehicles according to the present invention include alpha terpineol, toluene and ethylene glycol.

TABLE 4

Organic Vehicles Useful in Precursor Compositions

| Formula/Class | Name |
| --- | --- |
| Alcohols | 2-Octanol |
| | Benzyl alcohol |
| | 4-hydroxy-3methoxy benzaldehyde |
| | Isodeconol |
| | Butylcarbitol |
| Terpene alcohol | Alpha-terpineol |
| | Beta-terpineol |
| | Cineol |
| Esters | 2,2,4 trimethylpentanediol-1,3 monoisobutyrate |
| | Butyl carbitol acetate |
| | Butyl oxalate |
| | Dibutyl phthalate |
| | Dibutyl benzoate |
| | Butyl cellosolve acetate |
| | Ethylene glycol diacetate |
| | Ethylene glycol diacetate |
| | N-methyl-2-pyrrolidone |
| Amides | N,N-dimethyl formamide |
| | N,N-dimethyl acetamide |
| Aromatics | Xylenes |
| | Aromasol |
| Substituted aromatics | Nitrobenzene |
| | o-nitrotoluene |
| Terpenes | Alpha-pinene, beta-pinene, dipentene, dipentene oxide |
| Essential Oils | Rosemary, lavender, fennel, sassafras, wintergreen, anise oils, camphor, turpentine |

The low viscosity precursor compositions in accordance with the present invention can also include one or more polymers. The polymers can be thermoplastic polymers or thermoset polymers. Thermoplastic polymers are characterized by being fully polymerized. They do not take part in any reactions to further polymerize or cross-link to form a final product. Typically, such thermoplastic polymers are melt-cast, injection molded or dissolved in a solvent. Examples include polyimide films, ABS plastics, vinyl, acrylic, styrene polymers of medium or high molecular weight and the like.

The polymers can also be thermoset polymers, which are characterized by not being fully polymerized or cured. The components that make up thermoset polymers must undergo further reactions to form fully polymerized, cross-linked or dense final products. Thermoset polymers tend to be resistant to solvents, heat, moisture and light.

A typical thermoset polymer mixture initially includes a monomer, resin or low molecular weight polymer. These components require heat, hardeners, light or a combination of the three to fully polymerize. Hardeners are used to speed the polymerization reactions. Some thermoset polymer systems are two part epoxies that are mixed at consumption or are mixed, stored and used as needed.

Specific examples of thermoset polymers include amine or amide-based epoxies such as diethylenetriamine, polyglycoldianine and triethylenetetramine. Other examples include imidazole, aromatic epoxies, brominated epoxies, thermoset PET, phenolic resins such as bisphenol-A, polymide, acrylics, urethanes and silicones. Hardeners can include isophoronediamine and meta-phenylenediamene.

The polymer can also be an ultraviolet or other light-curable polymer. The polymers in this category are typically UV and light-curable materials that require photoinitiators to initiate the cure. Light energy is absorbed by the photoinitiators in the formulation causing them to fragment into reactive species, which can polymerize or cross-link with other components in the formulation. In acrylate-based adhesives, the reactive species formed in the initiation step are known as free radicals. Another type of photoinitiator, a cationic salt, is used to polymerize epoxy functional resins generating an acid, which reacts to create the cure. Examples of these polymers include cyanoacrylates such as z-cyanoacrylic acid methyl ester with an initiator as well as typical epoxy resin with a cationic salt.

The polymers can also be conductive polymers such as intrinsically conductive polymers. Conductive polymers are disclosed, for example, in U.S. Pat. No. 4,959,430 by Jonas et al., which is incorporated herein by reference in its entirety. Other examples of intrinsically conductive polymers are listed in Table 5 below.

another substance. The reducing agent loses one or more electrons and is referred to as having been oxidized. For example, copper and nickel metal have a strong tendency to oxidize. The compositions including nickel or copper precursors according to the present invention should preferably include reducing agents as additives to provide reaction conditions for the formation of the metal at the desired temperature, rather than the metal oxide. Reducing agents are particularly applicable when using molecular metal precursor compounds where the ligand is not reducing by itself. Examples of reducing agents include amino alcohols. Alternatively, the precursor conversion process can take place under reducing atmosphere, such as hydrogen or forming gas.

In some cases, the addition of a reducing agent results in the formation of the metal even under ambient conditions. The reducing agent can be part of the precursor itself, for example in the case of certain ligands. An example is Cu-formate where the precursor forms copper metal even in ambient air at low temperatures. In addition, the Cu-formate precursor is highly soluble in water, results in a relatively high metallic yield and forms only gaseous byproducts, which are reducing in nature and protect the in-situ formed copper from oxidation. Copper formate is therefore a preferred copper precursor for aqueous based precursor compositions. Other examples of molecular metal precursors containing a ligand that is a reducing agent are Ni-acetylacetonate and Ni-formate.

TABLE 5

Intrinsically Conductive Polymers

| Examples | Class/Monomers | Catalyst/Dopant |
|---|---|---|
| | Polyacetylene | |
| Poly[bis(benzylthio) acetylene] | Phenyl vinyl sulfoxide | Ti alkylidene |
| Poly[bis(ethylthio)acetylene] | | |
| Poly[bis(methylthio)acetylene] | 1,3,5,7-Cyclooctatetraene | |
| | Polyaniline | |
| Fully reduced | | organic sulfonic acids such as: |
| Half oxidized | | Dinonylnaphthalenedisulfonc acid |
| | | Dinonylnaphthaleneusulfonic acid |
| | | Dodecylbenzenesulfonic acid |
| | Poly(anilinesulfonic acid) | |
| Self-doped state | | |
| | Polypyrrole | |
| | | Organic sulfonic acid |
| | Polythiophene | |
| Poly(thiophine-2.5-diyl) | 2,5-Dibromo-3-alkyl/arylthiophene | |
| Poly(3-alkylthiophene-2.5-diyl) | alkyl = butyl, hexyl, octyl, | |
| alkyl = butyl, hexyl, octyl, decyl, dodecyl | decyl, dodecyl | |
| Poly(styrenesulfonate)/poly-(2,3-dihydrothieno-[3,4-b]-1,4-dioxin) | aryl = phenyl | |
| | Dibromodithiophene | |
| | Terthiophene | |
| | Other substituted thiophenes | |
| | Poly(1,4-phenylenevinylene) (PPV) | |
| | p-Xylylenebis (tetrahydrothiopheniumchloride)) | |
| | Poly(1,4-phenylene sulfide) | |
| | Poly(fluroenyleneethynylene) | |

Other additives can be included in the low viscosity precursor compositions in accordance with the present invention. Among these are reducing agents to prevent the undesirable oxidation of metal species. Reducing agents are materials that are oxidized, thereby causing the reduction of The precursor compositions can also include crystallization inhibitors and a preferred crystallization inhibitor is lactic acid. Such inhibitors reduce the formation of large crystallites directly from the molecular metal precursor, which can be detrimental to conductivity. Other crystallization inhibitors include ethylcellulose and polymers such as styrene allyl alcohol (SAA) and polyvinyl pirolydone (PVP). For example, in some silver precursor compositions small additions of lactic acid completely prevent crystallization. In other cases, such as in aqueous Cu-formate compositions, small amounts of glycerol can act as a crystallization inhibitor. Other compounds useful for reducing crystallization are other polyalcohols such as malto dextrin, sodium carboxymethylcellulose and TRITON X100. In general, solvents with a higher melting point and lower vapor pressure inhibit crystallization of any given compound more than a lower melting point solvent with a higher vapor pressure. In one embodiment, not greater than about 10 weight percent crystallization inhibitor as a percentage of total composition is added, preferably not greater than 5 weight percent and more preferably not greater than 2 weight percent.

The low viscosity precursor compositions can also include an adhesion promoter adapted to improve the adhesion of the conductive feature to the underlying substrate. For example, polyamic acid can improve the adhesion of the composition to a polymer substrate. In addition, the precursor compositions can include rheology modifiers. As an example, styrene allyl alcohol (SAA) can be added to the precursor composition to reduce spreading on the substrate.

The low viscosity precursor compositions can also include complexing agents. Complexing agents are a molecule or species that binds to a metal atom and isolates the metal atom from solution. Complexing agents are adapted to increase the solubility of the molecular precursors in the solvent, resulting in a higher yield of metal. One preferred complexing agent, particularly for use with Cu-formate and Ni-formate, is 3-amino-1-proponal. For example, a preferred precursor composition for the formation of copper includes Cu-formate dissolved in water and 3-amino-1-propanol.

The low viscosity precursor compositions above can also include rheology modifiers. Rheology modifiers can include SOLTHIX 250 (Avecia Limited), SOLSPERSE 21000 (Avecia Limited), styrene allyl alcohol (SAA), ethyl cellulose, carboxy methylcellulose, nitrocellulose, polyalkylene carbonates, ethyl nitrocellulose, and the like. These additives can reduce spreading of the precursor composition after deposition, as is discussed in more detail below.

The precursor compositions above can also include other components such as wetting angle modifiers, humectants and the like.

In accordance with the foregoing, the low viscosity precursor compositions according to the present invention can include combinations of particles (nanoparticles and/or micron-size particles), molecular metal precursor compounds, solvents, vehicles, reducing agents, crystallization inhibitors, adhesion promoters, and other minor additives to control properties such as surface tension.

For low viscosity precursor compositions, it is preferred that the total loading of particulates (nanoparticles and micron-size particles) is not greater than about 75 weight percent, such as from about 5 wt. % to about 50 wt. %. Loading in excess of the preferred amount can lead to higher viscosities and undesirable flow properties. It is particularly preferred that the total loading of micron-size particles not exceed about 50 weight percent and that the total loading of nanoparticles not exceed about 75 weight percent. In one preferred embodiment, the low viscosity precursor composition includes from about 5 to about 50 weight percent nanoparticles and substantially no micron-size particles.

A preferred low viscosity precursor composition comprises at least one molecular metal precursor where the precursor is highly soluble in the selected aqueous or organic solvent. Preferably, the precursor composition includes at least about 20 weight percent of molecular metal precursor, such as from about 30 weight percent to about 60 weight percent. It is particularly preferred that the molecular metal precursor be added to the precursor composition up to the solubility limit of the precursor compound in the solvent.

According to the present invention, the precursor composition is carefully selected to reduce the conversion temperature required to convert the metal precursor compound to the conductive metal. The precursor converts at a low temperature by itself or in combination with other precursors and provides for a high metal yield. As used herein, the conversion temperature is the temperature at which the metal species contained in the molecular metal precursor compound, is at least 95 percent converted to the pure metal. As used herein, the conversion temperature is measured using a thermogravimetric analysis (TGA) technique wherein a 50-milligram sample of the precursor composition is heated at a rate of 10° C./minute in air and the weight loss is measured.

A preferred approach for reducing the conversion temperature according to the present invention is to bring the molecular metal precursor compound into contact with a conversion reaction inducing agent. As used herein, a conversion reaction inducing agent is a chemical compound that effectively reduces the temperature at which the molecular metal precursor compound decomposes to the metal. The conversion reaction inducing agent can either be added into the original precursor composition or added in a separate step during conversion on the substrate. The former method is preferred. Preferably, the conversion temperature of the metal precursors can be preferably lowered by at least about 25° C., more preferably by at least about 50° C. even more preferably by at least about 100° C., as compared to the dry metal precursor compound.

The reaction inducing agent can be the solvent or vehicle that is used for the precursor composition. For example, the addition of certain alcohols can reduce the conversion temperature of the precursor composition. Preferred alcohols for use as conversion reaction inducing agents according to the present invention include terpineol and diethyleneglycol butylether (DEGBE). It will be appreciated that the alcohol can also be the vehicle, such as in the case of terpineol.

More generally, organic alcohols such as primary and secondary alcohols that can be oxidized to aldehydes or ketones, respectively, can advantageously be used as the conversion reaction inducing agent. Examples are 1-butanol, diethyleneglycol, DEGBE, octanol, and the like. The choice of the alcohol is determined by its reducing capability as well as its boiling point, viscosity and precursor solubilizing capability. It has been discovered that some tertiary alcohols can also lower the conversion temperature of some molecular precursors. For example, alpha-terpineol, which also serves as a vehicle, significantly lowers the conversion temperature of some molecular metal precursors. The boiling point of the conversion reaction inducing agents is preferably high enough to provide for the preferred ratio of metal ions to inducing agent during conversion to metal. It should also be low enough for the inducing agent to escape the deposit cleanly without unwanted side reactions that could lead to carbon residues in the final film. The preferred ratio of metal precursor to inducing agent is stoichiometric for complete reduction. However, in some cases catalytic amounts of the inducing agent are sufficient.

Some solvents, such as DMAc, can serve as a solvent, vehicle and a conversion reaction inducing agent. It can also be regarded as a complexing agent for silver. This means that precursors such as Ag-nitrate that are otherwise not very soluble in organic solvents can be brought into solution by complexing the metal ion with a complexing agent such as DMAc. In this specific case, Ag-nitrate can form a 1:1 adduct with DMAc which is soluble in organic solvents such as N-methylpyrrolidinone (NMP) or DMAc.

Another preferred approach to reducing the conversion temperature of the molecular precursor is utilizing a palladium compound as a conversion reaction inducing agent. According to this embodiment, a palladium precursor compound is added to the precursor composition, which includes another precursor such as a silver precursor. With addition of various Pd compounds, the conversion temperature of the silver precursor can be advantageously reduced by at least 25° C. and more preferably by at least 50° C. Preferred palladium precursors according to this embodiment of the present invention include Pd-acetate, Pd-trifluoroacetate, Pd-neodecanoate and tetraammine palladium hydroxide. Pd-acetate and Pd-trifluoroacetate are particularly preferred as conversion reaction inducing agents to reduce the conversion temperature of a silver metal carboxylate compound. Small additions of Pd-acetate to a precursor composition that includes Ag-trifluoroacetate in DMAc can lower the decomposition temperature by up to 80° C. Preferred are additions of Pd-acetate or Pd-trifluoroacetate in an amount of at least about 1 weight percent, more preferably at least about 2 weight percent. The upper range for this Pd conversion reaction inducing agent is limited by its solubility in the solvent and in one embodiment does not exceed about 10 weight percent. Most preferred is the use of Pd-trifluoroacetate because of its high solubility in organic solvents. For example, a preferred precursor composition for a silver/palladium alloy according to the present invention is Ag-trifluoroacetate and Pd-trifluoroacetate dissolved in DMAc and lactic acid.

A complete range of homogenous Ag/Pd alloys can be formed with a Ag-trifluoroacetate/Pd-trifluoroacetate combination in a solvent such as DMAc. The molecular mixing of the metal precursors provides preferred conditions for the formation of virtually any Ag/Pd alloy at low temperature. The conversion temperature of the silver precursor when dissolved in DMAc is preferably reduced by at least 80° C. when combined with Pd-trifluoroacetate. Pure Pd-trifluoroacetate dissolved in DMAc can be converted to pure palladium at a similar temperature.

Other conversion reaction inducing agents that can also lower the conversion temperature for base metals such as nickel and copper can be used such as amines (ammonia, ethylamine, propylamine), amides (DMAc, dimethylformamide, methylformamide, imidazole, pyridine), alcohols such as aminoalcohols (ethanol amine, diethanolamine and triethanolamine), aldehydes (formaldehyde, benzaldehyde, acetaldehyde); formic acid; thiols such as ethyl thioalcohol, phosphines such as trimethylphosphine or triethylphosphine and phosphides. Still other conversion reaction inducing agents can be selected from boranes and borohydrides such as borane-dimethylamine or borane-trimethylamine. Preferred conversion reaction inducing agents are alcohols and amides.

Another factor that has been found to influence the conversion temperature is the ratio of molecular metal precursor to conversion reaction inducing agent. It has been found that the addition of various amounts of DEGBE to a molecular silver precursor such as Ag-trifluoroacetate in DMAc further reduces the precursor conversion temperature, for example by up to about 70° C. Most preferred is the addition of stoichiometric amounts of the inducing agent such as DEGBE. Excess amounts of conversion temperature inducing agent are not preferred because it does not lower the temperature any further. In addition, higher amounts of solvent or inducing agents lower the overall concentration of molecular precursor in the precursor composition and can negate other characteristics such as the composition being in the preferred viscosity and surface tension range. The ratio of inducing agent to metal ion that is reduced to metal during conversion can be expressed as a molar ratio of functional group (inducing part in the reducing agent) to metal ion. The ratio is preferably about 1, such as in the range from about 1.5 to about 0.5 and more preferably in the range of about 1.25 to about 0.75 for univalent metal ions such as Ag. For divalent metal ions the ratio is preferably about 2, such as in the range from about 3 to 1, and for trivalent metals the ratio is preferably about 3, such as in the range from about 4.5 to 1.5.

The molecular precursor preferably provides as high a yield of metal as possible. A preferred ratio of molecular precursor to solvent is that corresponding to greater than 10% mass fraction of metal relative to the total weight of the liquid (i.e., all precursor components excluding particles). As an example, at least 10 grams of conductor is preferably contained in 100 grams of the precursor composition. More preferably, greater than 20 wt. % of the precursor composition is metal, even more preferably greater than 30 wt. %, even more preferably greater than 40 wt. % and most preferably greater than 50 wt. %.

Yet another preferred approach for reducing the conversion temperature is to catalyze the reactions using particles, particularly nanoparticles. Preferred powders that catalyze the reaction include pure Pd, Ag/Pd alloy particles and other alloys of Pd as well as Pt and alloys of Pt. Another approach for reducing the conversion temperature is to use gaseous reducing agents such as hydrogen or forming gas.

Yet another preferred approach for reducing the conversion temperature is ester elimination, either solvent assisted or without solvent assist. Solvent assist refers to a process wherein the metal alkoxide is converted to an oxide by eliminating an ester. In one embodiment, a metal carboxylate and metal alkoxide are mixed in the precursor composition. At the processing temperature the two precursors react and eliminate an organic ester to form a metal oxide, which decomposes to the corresponding metal at a lower temperature than the precursors themselves. This is also useful for Ag and Au, where for Au the metal oxide formation is skipped.

Another preferred approach for reducing the conversion temperature is by photochemical reduction. For example, photochemical reduction of Ag can be achieved by using precursors containing silver bonds that can be broken photochemically. Another method is to induce photochemical reduction of a silver precursor on prepared surfaces where the surface catalyzes the photochemical reaction.

Another preferred approach for reducing the conversion temperature is in-situ precursor generation by reaction of ligands with particles. For example, silver oxide particles can be a starting material and can be incorporated into low viscosity precursor compositions in the form of nanoparticles. The silver oxide can react with deprotonateable organic compounds to form the corresponding silver salts. For example, silver oxide can be mixed with a carboxylic acid to form silver carboxylate. Preferred carboxylic acids include acetic acid, neodecanoic acid and trifluoroacetic acid. Other carboxylic acids work as well. For example, DARVAN C (Vanderbilt Chemical) can react its carboxylic function with the metal oxide. Small silver particles that are coated with a thin silver oxide layer can also be reacted with these compounds. Another potential benefit is simultaneously gained with regard to rheology in that such a surface modification can lead to improved particle loadings in low viscosity formulations. Another example is the reaction of CuO coated silver powder with carboxylic acids. This procedure can be applied more generally to other oxides such as copper oxide, palladium oxide and nickel oxide particles as well. Other deprotonateable compounds are halogeno-, hydroxy- and other alkyl and aryl derivatives of carboxylic acids, beta diketones, more acidic alcohols such as phenol, and hydrogentetrafluoroborates.

Thus, as is discussed above and illustrated by the examples below, the precursor compositions of the present invention can have a precursor conversion temperature that is significantly lower than the decomposition temperature of the dry metal precursor compound. In one embodiment, the conversion temperature is not greater than about 250° C., such as not greater than about 225° C., more preferably is not greater than about 200° C. and even more preferably is not greater than about 185° C. In certain embodiments, the conversion temperature can be not greater than about 150° C., such as not greater than about 125° C. and even not greater than about 100° C.

Substrates

The precursor compositions according to the present invention can be deposited and converted to the conductive feature at low temperatures, thereby enabling the use of a variety of substrates having a relatively low melting or decomposition temperature. During conversion of low viscosity precursor compositions to the conductive feature, the substrate surface that the composition is printed onto significantly influences how the overall conversion to a final structure occurs.

The types of substrates that are particularly useful according to the present invention include polyfluorinated compounds, polyimides, epoxies (including glass-filled epoxy), polycarbonates and many other polymers. Particularly useful substrates include cellulose-based materials such as wood or paper, acetate, polyester, polyethylene, polypropylene, polyvinyl chloride, acrylonitrile, butadiene (ABS), flexible fiber board, non-woven polymeric fabric, cloth, metallic foil and thin glass. The substrate can be coated, for example a dielectric on a metallic foil. Although the present invention can be used for such low-temperature substrates, it will be appreciated that traditional substrates such as ceramic substrates can also be used in accordance with the present invention.

According to a particularly preferred embodiment of the present invention, the substrate onto which the precursor composition is deposited and converted to a conductive feature has a softening point of not greater than about 225° C., preferably not greater than about 200° C., even more preferably not greater than about 185° C. even more preferably not greater than about 150° C. and even more preferably not greater than about 100° C.

Deposition of Fine Features

One difficulty in printing and processing low viscosity precursor compositions is that the composition can wet the surface and rapidly spread to increase the width of the deposit, thereby negating the advantages of fine line printing. This is particularly true when ink-jet printing is employed to deposit fine features such as interconnects, because ink-jet technology puts strict upper boundaries on the viscosity of the composition that can be employed. Nonetheless, ink-jet printing is a preferred low-cost, large-area deposition technology that can be used to deposit the precursor compositions of the present invention.

According to a preferred embodiment of the present invention, the low viscosity precursor compositions can be confined on the substrate, thereby enabling the formation of features having a small minimum feature size, the minimum feature size being the smallest dimension in the x-y axis, such as the width of a conductive line. The precursor composition can be confined to regions having a width of not greater than 100 μm, preferably not greater than 75 μm, more preferably not greater than 50 μm, even more preferably not greater than 25 μm, and even more preferably not greater than 10 μm, such as not greater than about 5 μm. The present invention provides compositions and methods of processing that advantageously reduce the spreading of the low viscosity composition. For example, small amounts of rheology modifiers such as styrene allyl alcohol (SAA) and other polymers can be added to the precursor composition to reduce spreading. The spreading can also be controlled through combinations of nanoparticles and precursors. Spreading can also be controlled by rapidly drying the compositions during printing by irradiating the composition during deposition.

Spreading can also be controlled by the addition of a low decomposition temperature polymer in monomer form. The monomer can be cured during deposition by thermal or ultraviolet means, providing a network structure to maintain line shape. The polymer can then be either retained or removed during subsequent processing of the conductor.

A preferred method is to pattern an otherwise non-wetting substrate with wetting enhancement agents that control the spreading and also yield increased adhesion. For example, this can be achieved by functionalizing the substrate surface with hydroxide or carboxylate groups.

Fabrication of conductor features with feature widths of not greater than 100 μm or features with minimum feature size of not greater than 100 μm from a low viscosity composition requires the confinement of the low viscosity precursor compositions so that the composition does not spread over certain defined boundaries. Various methods can be used to confine the composition on a surface, including surface energy patterning by increasing or decreasing the hydrophobicity (surface energy) of the surface in selected regions corresponding to where it is desired to confine the precursor or eliminate the precursor. These can be classified as physical barriers, electrostatic and magnetic barriers surface energy differences, and process related methods such as increasing the precursor viscosity to reduce spreading, for example by freezing or drying the composition very rapidly once it strikes the surface.

In physical barrier approaches, a confining structure is formed that keeps the precursor composition from spreading. These confining structures may be trenches and cavities of various shapes and depths below a flat or curved surface which confine the flow of the precursor composition. Such trenches can be formed by chemical etching or by photochemical means. The physical structure confining the precursor can also be formed by mechanical means including embossing a pattern into a softened surface or means of mechanical milling, grinding or scratching features. Trenches can also be formed thermally, for example by locally melting a low melting point coating such as a wax coating. Alternatively, retaining barriers and patches can be deposited to confine the flow of composition within a certain region. For example, a photoresist layer can be spin coated on a polymer substrate. Photolithography can be used to form trenches and other patterns in this photoresist layer. These patterns can be used to retain precursor that is deposited onto these preformed patterns. After drying, the photolithographic mask may or may not be removed with the appropriate solvents without removing the deposited metal. Retaining barriers can also be deposited with direct write deposition approaches such as ink-jet printing or any other direct writing approach, as disclosed herein.

For example, a polymer trench can be ink-jet printed onto a flat substrate by depositing two parallel lines with narrow parallel spacing. A precursor composition can be printed between the two polymer lines to confine the composition. Another group of physical barriers include printed lines or features with a certain level of porosity that can retain a low viscosity composition by capillary forces. The confinement layer may comprise particles applied by any of the techniques disclosed herein. The particles confine the precursor composition that is deposited onto the particles to the spaces between the particles because of wetting of the particles by the precursor composition. In one embodiment, the particles are surface modified to make them hydrophilic and the composition is hydrophilic with the substrate being hydrophobic.

In one particular example, carbon particles are deposited onto a substrate with a 75 μm resolution using electrostatic laser printing. A silver precursor composition can be subsequently applied to this printed pattern and the resolution is retained while the printed line has a bulk conductivity of 10 milli-ohm-cm after heating at 200° C.

Surface energy patterning can be classified by how the patterning is formed, namely by mechanical, thermal, chemical or photochemical means. In mechanical methods, the physical structure confining the precursor composition is formed by mechanical means including embossing a pattern into a softened surface, milling features, or building up features to confine the composition. In thermal methods, heating of the substrate is used to change the surface energy of the surface, either across the entire surface or in selected locations, such as by using a laser or thermal print head. In chemical methods, the entire surface or portions of the surface are chemically modified by reaction with some other species. In one embodiment, the chemical reaction is driven by local laser heating with either a continuous wave or pulsed laser. In photochemical methods, light from either a conventional source or from a laser is used to drive photochemical reactions that result in changes in surface energy.

The methods of confining precursor compositions disclosed herein can involve two steps in series—first the formation of a confining pattern, that may be a physical or chemical confinement method, and second, the application of a precursor composition to the desired confinement areas.

Electrostatic printing can be used to print high resolution patterns that correspond to at least two levels of surface energies. In one embodiment, the electrostatic printing is carried out on a hydrophobic surface and a hydrophilic material is printed. The regions where no printing occurs correspond to hydrophobic material. A hydrophobic precursor composition can then be printed onto the hydrophobic regions thereby confining the composition. Alternatively, a hydrophilic composition can be printed onto the hydrophilic electrostatically printed regions. The width of the hydrophobic and hydrophilic regions can be not greater than 100 μm, more preferably are not greater than 75 μm, more preferably not greater than about 50 μm and even more preferably not greater than about 25 μm.

The precursor composition confinement may be accomplished by applying a photoresist and then laser patterning the photoresist and removing portions of the photoresist. The confinement may be accomplished by a polymeric resist that has been applied by another jetting technique or by any other technique resulting in a patterned polymer. In one embodiment, the polymeric resist is hydrophobic and the substrate surface is hydrophilic. In that case, the precursor composition utilized is hydrophilic resulting in confinement of the composition in the portions of the substrate not covered by the polymeric resist.

A laser can be used in various ways to modify the surface energy of a substrate in a patterned manner. The laser can be used to remove hydroxyl groups through local heating. These regions are converted to more hydrophobic regions that can be used to confine a hydrophobic or hydrophillic precursor composition. The laser can be used to remove selectively a previously applied surface layer formed by chemical reaction of the surface with a silanating agent.

In one embodiment, a surface is laser processed to increase the hydrophilicity in regions where the laser strikes the surface. A polyimide substrate coated with a thin layer of hydrophobic material, such as a fluorinated polymer. A laser, such as a pulsed YAG, excimer or other UV or shorter wavelength pulsed laser, can be used to remove the hydrophobic surface layer exposing the hydrophilic layer underneath. Translating (e.g., on an x-y axis) the laser allows patterns of hydrophilic material to be formed. Subsequent application of a hydrophilic precursor composition to the hydrophilic regions allows confinement of the composition. Alternatively, a hydrophobic precursor composition can be used and applied to the hydrophobic regions resulting in composition confinement.

In another embodiment of the present invention, a surface is laser processed to increase the hydrophobicity in regions where the laser strikes the surface. A hydrophobic substrate such as a fluorinated polymer can be chemically modified to form a hydrophilic layer on its surface. Suitable modifying chemicals include solutions of sodium naphthalenide. Suitable substrates include polytetrafluoroethylene and other fluorinated polymers. The dark hydrophilic material formed by exposing the polymer to the solution can be removed in selected regions by using a laser. Continuous wave and pulsed lasers can be used. Hydrophilic precursor compositions, for example aqueous based compositions, can be applied to the remaining dark material. Alternatively, hydrophobic precursor compositions, such as those based on solutions in nonpolar solvents, can be applied to the regions where the dark material was removed leaving the hydrophobic material underneath. Ceramic surfaces can be hydroxylated by heating in moist air or otherwise exposing the surface to moisture. The hydroxylated surfaces can be silanated to create a monolayer of hydrophobic molecules. The laser can be used to selectively remove the hydrophobic surface layer exposing the hydrophilic material underneath. A hydrophobic patterned layer can be formed directly by micro-contact printing using a stamp to apply a material that reacts with the surface to leave exposed a hydrophobic material such as alkyl chain. The precursor composition can be applied directly to the hydrophilic regions or hydrophobic regions using a hydrophilic or hydrophobic precursor composition, respectively.

A surface with patterned regions of hydrophobic and hydrophilic regions can be formed by micro-contact printing. In this approach, a stamp is used to apply a reagent to selected regions of a surface. This reagent can form a self-assembled monolayer that provides a hydrophobic surface. The regions between the hydrophobic surface regions can be used to confine a hydrophilic precursor composition.

Precursor composition modification can also be employed to confine the composition on the substrate. Such methods restrict spreading of the compositions by methods other than substrate modification. A precursor composition including a binder can be used for surface confinement. The binder can be chosen such that it is a solid at room temperature, but is a liquid suitable for ink-jet deposition at higher temperatures. These compositions are suitable for deposition through, for example, a heated ink-jet head. The precursor composition can also include metal particles. The precursor composition that is frozen on the surface can provide linear features having widths of not greater than 100 µm, more preferably not greater than 75 µm and more preferably not greater than 50 µm. The precursor composition can also include a molecular precursor that is capable of forming a metal when heated or irradiated by light. The precursor composition can combine conductive particles and a molecular precursor.

Binders can also be used in the precursor compositions of the present invention to provide mechanical cohesion and limit spreading of the composition after deposition. In one preferred embodiment, the binder is a solid at room temperature. During ink-jet printing, the binder is heated and becomes flowable. The binder can be a polymer or in some cases can be a precursor. In one embodiment, the binder is a solid at room temperature, when heated to greater than 50° C. the binder melts and flows allowing for ease of transfer and good wetting of the substrate, then upon cooling to room temperature the binder becomes solid again maintaining the shape of the deposited pattern. The binder can also react in some instances. Preferred binders include waxes, styrene allyl alcohols, poly alkylene carbonates, polyvinyl acetals, cellulose based materials, tetradecanol, trimethylolpropane and tetramethylbenzene. The preferred binders have good solubility in the solvent used in the precursor composition and should be processable in the melt form. For example, styrene allyl alcohol is soluble in dimethylacetimide, solid at room temperature and becomes fluid-like upon heating to 80° C.

The binder in many cases should depart out of the ink-jet printed feature or decompose cleanly during thermal processing, leaving little or no residuals after processing the precursor composition. The departure or decomposition can include vaporization, sublimation, unzipping, partial polymer chain breaking, combustion, or other chemical reactions induced by a reactant present on the substrate material, or deposited on top of the material.

An example of a precursor as a binder is the use of Ag-trifluoroacetate with DMAc. The DMAc will form adducts with the Ag-trifluoroacetate which then acts as a binder as well as the silver precursor.

Other methods for controlling the spreading during printing of a low viscosity precursor composition according to the present invention include the steps of depositing a composition onto a cooled substrate, freezing the composition as the droplets contact the substrate, removing at least the solvent without melting the composition, and converting the remaining components of the composition to an electronic material. The melting point of the composition is preferably less than 25° C. Preferred solvents include higher molecular weight alcohols. It is preferred to cool the substrate to less than 10° C.

The surface of a substrate can be pretreated with a reactant, in one embodiment a reactant that does not contain a metal. This reactant can be a reducing agent for a metal-containing precursor. The surface can be completely coated or regions can be coated with any approach including screen printing, ink-jet printing, spin coating, dip coating, spraying, or any other approach. In a second step, a metal containing reactant is ink-jet printed onto the surface. The metal containing precursor reacts with the co-reactant on the surface to form metal. The reaction is rapid enough to confine the spreading of the metal on the surface. In one embodiment, the metal containing precursor comprise silver or copper. The co-reactant on the surface can comprise a reducing agent for the metal. Alternatively, a reducing agent or reaction inducing agent can be printed locally prior to or following the deposition of the metal precursor composition. By performing both printing steps within a short time frame and by ensuring that the co-reactant triggered decomposition reaction occurs fast enough to avoid spreading of the precursor composition, fine features can be deposited. All the metal-containing compounds and reducing agents discussed herein can be used in this approach.

Yet another method for controlling the spreading of a low viscosity precursor composition during printing is provided. The method comprises depositing a precursor composition onto a substrate, simultaneously irradiating the deposited composition with light to limit the spreading of the composition on the surface and converting the composition to a conductive feature. UV light can be used to photochemically decompose a metal precursor to a metal before spreading of the precursor composition occurs.

Yet another method for controlling the spreading during printing according to the present invention comprises the steps of depositing a precursor composition onto a porous substrate, thereby limiting the spreading of the composition, and converting the composition to a conductive feature. In one embodiment, the porosity in the substrate is created by laser patterning. The porosity can be limited to the very surface of the substrate.

Yet another method for controlling the spreading of a low viscosity precursor composition according to the present invention includes the steps of patterning the substrate to form regions with two distinct levels of porosity where the porous regions form the pattern of a desired feature. The precursor composition can then be deposited, such as by ink-jet printing, onto the regions defining the pattern thereby confining the precursor composition to these regions, and converting the deposited precursor composition to a conductive feature. Preferred substrates are polyimide, and epoxy laminates. In one embodiment the patterning is carried out with a laser. In another embodiment the patterning is carried out using photolithography. In another embodiment, capillary forces pull at least some portion of the composition into the porous substrate.

Spreading of the precursor composition is influenced by a number of factors. A drop of liquid placed onto a surface will either spread or not depending on the surface tensions of the liquid, the surface tension of the solid and the interfacial tension between the solid and the liquid. If the contact angle is greater than 90 degrees, the liquid is considered non-wetting and the liquid tends to bead or shrink away from the surface. For contact angles less than 90 degrees, the liquid can spread on the surface. For the liquid to completely wet, the contact angle must be zero. For spreading to occur, the surface tension of the liquid must be lower than the surface tension of the solid on which it resides.

In one embodiment, a precursor composition is applied, as by ink-jet deposition, to an unpatterned substrate. Unpatterned refers to the fact that the surface energy (tension) of the substrate has not been intentionally patterned for the sole purpose of confining the composition. It is to be understood that variations in surface energy (used synonymously herein with surface tension) of the substrate associated with devices, interconnects, vias, resists and any other functional features may already be present. For substrates with surface tensions of less than 30, a hydrophilic precursor composition can be based on water, glycerol, glycol, and other solvents or liquids having surface tensions of greater than 30 dynes/cm, more preferably greater than 40 dynes/cm and preferably greater than 50 dynes/cm and even greater than 60 dynes/cm. For substrates with surface tensions of less than 40, the solvents should have surface tensions of greater than 40 dynes/cm, preferably greater than 50 dynes/cm and even more preferably greater than 60 dynes/cm. For substrates with surface tensions less than 50, the surface tension of the precursor composition should be greater than 50 dynes/cm, preferably greater than 60 dynes/cm. Alternatively, the surface tension of the composition can be chosen to be 5, 10, 15, 20, or 25 dynes/cm greater than that of the substrate. Continuous ink jet heads often require surface tensions of 40 to 50 dynes/cm. Bubble-jet ink jet heads often require surface tensions of 35 to 45 dynes/cm. The previously described methods are particularly preferred for these types of deposition approaches.

In another embodiment, a precursor composition is applied, as by ink-jet deposition, to an unpatterned low surface energy (hydrophobic) surface that has been surface modified to provide a high surface energy (hydrophilic). The surface energy can be increased by hydroxylating the surface by various means known to those skilled in the art including exposing to oxidizing agents and water, heating in moist air and the like. The surface tension of the precursor composition can then be chosen to be 5, 10, 15, 20, or 25 dynes/cm less than that of the substrate. Piezo-jet ink jet heads operating with hot wax often require surface tensions of 25 to 30 dynes/cm. Piezo-jet ink jet heads operating with UV curable inks often require surface tensions of 25 to 30 dynes/cm. Bubble-jet ink jet heads operating with UV curable inks often require surface tensions of 20 to 30 dynes/cm. Surface tensions of roughly 20 to 30 dynes/cm are required for piezo-based ink jet heads using solvents. The previously described methods are particularly preferred for these types of applications.

Most electronic substrates with practical applications have low values of surface tension, in the range of 18 (polytetrafluoroethylene) to 45, often between 20 and 40 dynes/cm. In one approach to confining a precursor composition to a narrow line or other shape, a hydrophilic pattern corresponding to the pattern of the desired conductor feature is formed on the surface of a substrate through the methods discussed herein. A particularly preferred method uses a laser. For example, a laser can be used to remove a hydrophobic surface layer exposing a hydrophilic layer underneath. In one embodiment, the hydrophilic material pattern on the surface has a surface energy that is 5, 10, 15, 20, 25 or 30 dynes/cm greater than the surrounding substrate. In one embodiment, the surface tension of the composition is chosen to be less than the surface tension of the hydrophilic region but greater than the surface tension of the hydrophobic region. The surface tension of the composition can be chosen to be 5, 10, 15, 20 or 25 dynes/cm less than that of the hydrophilic regions. The surface tension of the composition can be chosen to be 5, 10, 15, 20 or 25 dynes/cm greater than that of the hydrophobic regions. In another approach, the surface energy of the composition is higher than the surface energy of both the hydrophobic and hydrophilic regions. The surface tension of the composition can be chosen to be 5, 10, 15, 20 or 25 dynes/cm greater than that of the hydrophilic regions. The surface tension of the ink is chosen to be 5, 10, 15, 20 or 25 dynes/cm less than that of the hydrophilic regions. This approach is preferred for aqueous-based precursor compositions and compositions with high surface tensions in general. Continuous ink jet heads often require surface tensions of 40 to 50 dynes/cm. Bubble-jet ink jet heads often require surface tensions of 35 to 45 dynes/cm. The previously described methods are particularly preferred for these types of applications that can handle compositions with high surface tensions.

In one embodiment of this latter approach, a hydrophilic composition is applied, as by ink-jet deposition, to the hydrophilic regions. For substrates with unpatterned hydrophobic regions with surface tensions of less than 30, the hydrophilic composition can be based on water, glycerol, glycol, and other solvents or liquids to provide compositions having surface tensions of greater than 30 dynes/cm, more preferably greater than 40, greater than 45, greater than 50, and even greater than 60 dynes/cm. For substrates with surface tensions of less than 40 in the hydrophobic regions, the compositions should have surface tensions of greater than 40, greater than 45, greater than 50 and greater than 60 dynes/cm. For substrates with surface tensions less than 50, the surface tension of the composition should be greater than 50 greater than 55, or greater than 60 dynes/cm. For hydrophilic regions with surface tensions of less than 30, the hydrophilic precursor compositions can be based on water, glycerol, glycol, and other solvents or liquids having surface tensions of greater than 30 dynes/cm, greater than 35 dynes/cm, greater than 40 and greater than 50, and even greater than 60 dynes/cm. For hydrophilic regions with surface tensions of less than 40, the compositions should have surface tensions of greater than 40, greater than 50 and greater than 60 dynes/cm. For hydrophilic regions with surface tensions less than 50, the surface tension of the composition should be greater than 50 or greater than 60 dynes/cm. For continuous ink-jet heads that require surface tensions of 40 to 50 dynes/cm. For bubble-jet ink-jet heads that require surface tensions of 35 to 45 dynes/cm. The previously described methods are particularly preferred for these types of applications.

In another approach to confining a composition to a narrow feature, a hydrophilic surface, or a hydrophobic surface that is rendered hydrophilic by surface modification, is patterned with a hydrophobic pattern. In one embodiment, the hydrophobic pattern has a surface energy that is 5, 10, 15, 20, 25 or 30 dynes/cm less than the surrounding substrate. This can be done by removing a hydrophilic surface layer using a laser to expose a hydrophobic region underneath. A hydrophobic precursor composition is applied to the hydrophobic surface regions to confine the composition. In one embodiment, the hydrophobic composition has a surface energy that is 5, 10, 15, 20, 25 or 30 dynes/cm less than the surrounding substrate. In one embodiment, the hydrophobic composition has a surface energy that is 5, 10, 15, 20, 25 or 30 dynes/cm greater than the surrounding substrate. In one embodiment, the hydrophobic precursor composition has a surface energy that is 5, 10, 15, 20, 25 or 30 dynes/cm less than the hydrophobic surface pattern. In one embodiment, the hydrophobic ink has a surface energy that is 5, 10, 15, 20, 25 or 30 dynes/cm greater than the hydrophobic surface pattern. In another embodiment, the surface tension of the composition is less than the hydrophilic regions and greater than the hydrophobic regions. The hydrophilic surface can have a surface tension of greater than 40, greater than 50 or greater than 60 dynes/cm. When the hydrophobic surface has a surface energy of greater than 40 dynes/cm, it is preferred to use an ink with surface tension of less than 40, even less than 30 dynes/cm, and less than 25 dynes/cm. When the hydrophobic surface has a surface energy of greater than 50 dynes/cm, it is preferred to use a composition with a surface tension of less than 50, preferably less than 40, even less than 30 dynes/cm, and more preferably less than 25 dynes/cm. When the hydrophobic surface has a surface tension of greater than 40 dynes/cm, it is preferred to use a precursor composition with a surface tension of less than 40, less than 35, less than 30 and even less than 25 dynes/cm.

Piezo-jet ink jet heads operating with hot wax often require surface tensions of 25 to 30 dynes/cm. Piezo-jet ink jet heads operating with UV curable inks often require surface tensions of 25 to 30 dynes/cm. Bubble-jet ink jet heads operating with UV curable inks often require surface tensions of 20-30 dynes/cm. Surface tensions of roughly 20 to 30 dynes/cm are required for piezo-based ink jet heads using solvents. The previously described methods are particularly preferred for these types of applications.

For inkjet heads and other deposition techniques that require surface tensions greater than 30 dynes/cm, a particularly preferred method for confining a precursor composition to a surface involves increasing the hydrophilicity of the surface to provide a surface tension greater than 40, greater than 45 or greater than 50 dynes/cm and then providing a hydrophobic surface pattern with surface tension lower than the surrounding surface. The surface tension of the pattern can be 5, 10, 15, 20 or 25 dynes/cm greater than the surface tension of the surrounding substrate.

Surfactants, molecules with hydrophobic tails corresponding to lower surface tension and hydrophilic ends corresponding to higher surface tension can be use to modify the compositions and substrates to achieve the values of surface tensions and interfacial energies required.

For the purposes of this application, hydrophobic means a material that has the opposite response to interaction with water. Hydrophobic materials have low surface tensions. They also do not have functional groups for making hydrogen bonds with water.

Hydrophilic means a material that has an affinity for water. Hydrophilic surfaces are wetted by water. Hydrophilic materials also have high values of surface tension. They can also form hydrogen bonds with water. The surface tensions for different liquids are listed in Table 6 and the surface energies for different solids are listed in Table 7.

TABLE 6

Surface Tensions of Various Liquids

| Liquid | Temp (° C.) | Surface Tension (dynes/cm) |
|---|---|---|
| Water | 20 | 72.75 |
| Acetamide | 85 C. | 39.3 |
| Acetone | 20 C. | 23.7 |
| Acetonitrile | 20 | 29.3 |
| n-butyl alcohol | 20 C. | 24.6 |
| ethyl alcohol | 20 | 24 |
| Hexane | 20 | 18.4 |
| Isopropyl alcohol | 20 | 22 |
| Glycerol | 20 | 63.4 |
| Glycol | 20 | 47.7 |
| Tolulene | 20 | 29 |

TABLE 7

Surface Energies of Various Solids

| Material | Surface Energy (dynes/cm) |
|---|---|
| Glass | 30 |
| PTFE | 18 |
| Polyethylene | 31 |
| Polyvinychlorides | 41 |
| Polyvinylidene fluoride | 25 |
| Polypropylene | 29 |
| Polystyrene | 33 |
| Polyvinylchloride | 39 |
| Polysulfone | 41 |

TABLE 7-continued

Surface Energies of Various Solids

| Material | Surface Energy (dynes/cm) |
|---|---|
| Polycarbonate | 42 |
| Polyethylene terephthalate | 43 |
| Polyacryonitrile | 44 |
| Cellulose | 44 |

Another difficulty during printing and processing is that during drying, precursors in the composition can crystallize and form discontinuous lines that provide poor conductivity upon conversion to the conductor. This can be substantially prevented by adding small amounts of a crystallization inhibitor, as is discussed above.

The present invention also provides compositions and methods to increase adhesion of the conductive feature, referred to herein as adhesion promoters. Various substrates have different surface characteristics that result in varying degrees of adhesion. According to the present invention, the surface can be modified by hydroxylating or otherwise functionalizing the surface to provide reaction sites from the precursor compositions. In one embodiment, the surface of a polyfluorinated material is modified by a sodium naphthalenide solution that provides reactive sites for bonding during reaction with the precursor. In another embodiment, a thin layer of metal is sputtered onto the surface to provide for better adhesion of precursor composition or conductive feature to the substrate. In another embodiment, polyamic acid or similar materials are added to the composition that then bond with both the conductor and surface to provide adhesion. Preferred amounts of polyamic acid and related compounds are from about 1 to 10 weight percent of the low viscosity precursor composition.

In accordance with the foregoing, the precursor compositions according to the present invention can include a molecular precursor and a vehicle, without nanoparticles or micron-size particles. In one preferred embodiment, the precursor compositions include a conversion reaction inducing agent, which can be either or both of a powder, a molecular precursor or another inorganic or organic compound. In another embodiment, the low viscosity precursor composition includes additives to reduce spreading of the composition by controlling the wetting angle of the composition on the surface. In another embodiment, the combination of molecular precursor and solvent is chosen to provide a high solubility of the precursor in the solvent.

In another embodiment, the precursor composition includes hollow or porous micron-size particles, a molecular precursor and a vehicle. The molecular precursor is preferably a metal organic compound. In another embodiment, the precursor composition includes hollow or porous micron-size particles, nanoparticles and a vehicle. In another embodiment, the precursor composition includes hollow or porous micron-size particles, a molecular precursor, nanoparticles and a vehicle. The precursor is preferably a metal organic compound.

The precursor composition can also include a molecular precursor, a vehicle and nanoparticles. The nanoparticles can be selected from silver, copper and other metals, or can be non-conductive nanoparticles such as silica, copper oxide and aluminum oxide.

The precursor compositions can also include a molecular precursor, a vehicle, and a polymer or polymer precursor, such as in cases where adhesion to a polymeric substrate is desired. The precursor to a polymer can be poly (amic) acid. The polymer can be an epoxy, polyimide, phenolic resin, thermo set polyester, polyacrylate and the like. The low viscosity precursor compositions can include a low curing polymer, such as one that cures at not greater than 200° C., more preferably not greater than 150° C.

The precursor compositions can also include carbon, a molecular precursor and a vehicle. The compositions can include particulate carbon, such as conductive carbon, e.g., graphitic carbon. One preferred combination is conductive carbon with a molecular precursor to silver metal.

The precursor compositions can also include conductive transparent particles (e.g., ITO particles), a molecular precursor and a vehicle. The molecular precursors can include ITO precursors and metal precursors such as silver precursors.

The precursors compositions can also include a conductive polymer, molecular precursor and a vehicle. The polymer can be conductive for both electrons and protons. Electrically conductive polymers can be selected from polyacetylene, polyaniline, polyphenylene, polypyrrole, polythiophene, polyethylenedioxythiophene and poly (paraphenylene vinylene). Protonic conductive polymers include those with sulfonates or phosphates, for example sulfonated polyaniline.

The precursor compositions can also include glass or metal oxide nanoparticles, micron-size particles and a molecular precursor. The compositions can include nanoparticles of metal oxides such as silica, copper oxide, and aluminum oxide. Preferred molecular precursors according to this embodiment are metal organics.

The precursor compositions can also include conductive nanoparticles and vehicle. The flowable composition can further include a polymer precursor.

The low viscosity precursor compositions can also include an electrocatalyst or catalyst and a precursor. The precursor can be converted to a catalytically active material or can serve to fuse the layer together.

In the low viscosity precursor compositions that include a molecular precursor and powders (nanoparticles and/or micron-size particles), the ratio of precursors to powders is close to that corresponding to the amount needed to fill the spaces between particulates with material derived from the precursors. However, a significant improvement in conductivity can also be obtained for lower levels of molecular precursor. When particles are included in the precursor compositions of the present invention, it is preferred that at least about 10 vol. %, more preferably at least about 25 vol. % and even more preferably at least about 50 vol. % of the final conductor be derived from precursor.

Other specific low viscosity precursor compositions according to the present invention are preferred for different applications. Typically, the formulation for the low viscosity composition will take into account the deposition mechanism, the desired performance of the features and the relative cost of the features. For example, simple circuitry on a paper substrate designed for a disposable, high-volume application will require a low cost precursor composition but will not require electronic features having superior properties. On the other hand, higher end applications such as for repair of electronic circuitry will require electronic features having very good electrical properties and the relative cost of the low viscosity precursor composition will typically not be a significant factor.

According to one embodiment, the precursor composition can include particulates, including insulative particles such as $SiO_2$, particulates that are a precursor to a conductive phase such as silver oxide or silver nitrate particles, Ag trifluoroacetate crystallites, conductive micron-size particles and nanoparticles of the conductive phase, and a liquid phase made up of a vehicle and molecular metal precursors dissolved therein. For low viscosity compositions, the particulate fraction of the composition preferably is not greater than 25 volume percent of the total composition volume. The precursor fraction of the composition, both present in the form of precursor particles and molecular precursor dissolved in the vehicle, is typically expressed as a weight percent of the total composition weight and can be up to about 80 weight percent of the total composition weight.

In one embodiment, the low viscosity precursor composition includes up to about 20 volume percent carbon and from about 10 to about 15 weight percent of a molecular precursor, with the balance being vehicle and other additives. In another embodiment, the low viscosity precursor composition includes up to about 15 volume percent carbon and up to about 5 volume percent metal nanoparticles, with the balance being vehicle and other additives.

According to another embodiment, the low viscosity precursor composition includes up to about 75 weight percent metal nanoparticles, such as from 5 to 50 weight percent metal nanoparticles, and from about 10 to about 50 weight percent of a molecular precursor, wherein the balance is vehicle and other additives.

According to another embodiment, the low viscosity precursor composition includes up to about 20 volume percent micron-size metal particles and from about 10 to about 15 weight percent of a molecular precursor with the balance being vehicle and other additives. After heating at not greater than 250° C., the conductivity of the conductive feature is in the range from 1 to 5 times the bulk metal conductivity.

According to yet another embodiment, the low viscosity precursor composition includes up to about 20 volume percent micron-size metal particles, with the balance being a vehicle containing a precursor to a conductive polymer. After heating at not greater than 200° C. the bulk conductivity is in the range from 5 to 50 times the bulk conductivity of the metal phase.

In one embodiment of a transparent conductor precursor composition, the composition contains about 15 vol. % micron-size particles selected from the group of ITO, ATO, ZnO, $SnO_2$, and 5 vol. % Ag nanoparticles, and between 0 and 20 weight percent molecular precursor to Ag with the balance being solvents, vehicle and other additives.

In another embodiment of a transparent conductor precursor formulation, the composition contains up to about 30 vol. % micron-size particles selected from the group of ITO, ATO, ZnO, $SnO_2$, and between 5 and 40 weight percent precursor to Ag, with the balance being solvents, vehicle and other additives.

In yet another embodiment, a transparent conductor precursor composition contains up to about 15 vol. % micron size particles selected from the group of ITO, ATO, ZnO, $SnO_2$, and up to 10 vol. % conductive glass particles such as silver phosphate glass, and between 0 and 20 weight percent precursor to Ag with the balance being solvents, vehicle and other additives.

In addition to the foregoing, the low viscosity precursor compositions according to the present invention can also include carbon particles, such as graphitic particles. Depending upon the other components in the low viscosity precursor composition, carbon particle loading up to about 20 volume percent can be obtained in the compositions. The average particle size of the carbon particles is preferably not greater than about 1 µm and the carbon particles can advantageously have a bimodal or trimodal particle size distribution. Graphitic carbon has a bulk resistivity of about 1375 µΩ-cm and is particularly useful in low viscosity precursor compositions for conductive features that require a relatively low cost.

Deposition of Precursor Compositions

The low viscosity precursor compositions of the present invention can be deposited onto surfaces using a variety of tools.

As used herein, a low viscosity deposition tool is a device that deposits a liquid or liquid suspension onto a surface by ejecting the composition through an orifice toward the surface without the tool being in direct contact with the surface. The low viscosity deposition tool is preferably controllable over an x-y grid, referred to herein as a direct-write deposition tool. A preferred direct-write deposition tool according to the present invention is an ink-jet device. Other examples of direct-write deposition tools include aerosol jets and automated syringes, such as the MICROPEN tool, available from Ohmcraft, Inc., of Honeoye Falls, N.Y.

For use in an ink-jet, the viscosity of the precursor composition is preferably not greater than 50 centipoise, such as in the range of from about 10 to about 40 centipoise. For use in an aerosol jet atomization, the viscosity is preferably not greater than about 20 centipoise. Automated syringes can use compositions having a higher viscosity, such as up to about 5000 centipoise.

A preferred direct-write deposition tool according to the present invention is an ink-jet device. Ink-jet devices operate by generating droplets of the composition and directing the droplets toward a surface. The position of the ink-jet head is carefully controlled and can be highly automated so that discrete patterns of the composition can be applied to the surface. Ink-jet printers are capable of printing at a rate of 1000 drops per jet per second or higher and can print linear features with good resolution at a rate of 10 cm/sec or more, up to about 1000 cm/sec. Each drop generated by the ink-jet head includes approximately 25 to 100 picoliters of the composition, which is delivered to the surface. For these and other reasons, ink-jet devices are a highly desirable means for depositing materials onto a surface.

Typically, an ink-jet device includes an ink-jet head with one or more orifices having a diameter of not greater than about 100 µm, such as from about 50 µm to 75 µm. Droplets are generated and are directed through the orifice toward the surface being printed. Ink-jet printers typically utilize a piezoelectric driven system to generate the droplets, although other variations are also used. Ink-jet devices are described in more detail in, for example, U.S. Pat. No. 4,627,875 by Kobayashi et al. and U.S. Pat. No. 5,329,293 by Liker, each of which is incorporated herein by reference in their entirety. However, such devices have primarily been used to deposit inks of soluble dyes.

It is also important to simultaneously control the surface tension and the viscosity of the precursor composition to enable the use of industrial ink-jet devices. Preferably the surface tension is from about 10 to 50 dynes/cm, such as from about 20 to 40 dynes/cm, while the viscosity is maintained at not greater than about 50 centipoise.

According to one embodiment, the solids loading of particles in the low viscosity precursor composition is preferably as high as possible without adversely affecting the viscosity or other necessary properties of the composition. For example, the low viscosity precursor composition can have a particle loading of up to about 75 weight percent, and in one embodiment the particle loading is from about 5 to about 50 weight percent.

The precursor compositions for use in an ink-jet device can also include water and an alcohol. Surfactants can also be used to maintain the particles in suspension. Co-solvents, also known as humectants, can be used to prevent the precursor composition from crusting and clogging the orifice of the ink-jet head. Biocides can also be added to prevent bacterial growth over time. Examples of such ink-jet liquid vehicle compositions are disclosed in U.S. Pat. No. 5,853,470 by Martin et al.; U.S. Pat. No. 5,679,724 by Sacripante et al.; U.S. Pat. No. 5,725,647 by Carlson et al.; U.S. Pat. No. 4,877,451 by Winnik et al.; U.S. Pat. No. 5,837,045 by Johnson et al.; and U.S. Pat. No. 5,837,041 by Bean et al. Each of the foregoing U.S. patents is incorporated by reference herein in their entirety. The selection of such additives is based upon the desired properties of the composition, as is known to those skilled in the art. Particles can be mixed with the liquid vehicle using a mill or, for example, an ultrasonic processor.

The low viscosity precursor compositions according to the present invention can also be deposited by aerosol jet deposition. Aerosol jet deposition can enable the formation of conductive features having a feature width of not greater than about 200 µm, such as not greater than 100 µm, not greater than 75 µm and even not greater than 50 µm. In aerosol jet deposition, the precursor composition is aerosolized into droplets and the droplets are transported to the substrate in a flow gas through a flow channel. Typically, the flow channel is straight and relatively short.

The aerosol can be created using a number of atomization techniques. Examples include ultrasonic atomization, two-fluid spray head, pressure atomizing nozzles and the like. Ultrasonic atomization is preferred for compositions with low viscosities and low surface tension. Two-fluid and pressure atomizers are preferred for higher viscosity fluids. Solvent or other precursor components can be added to the precursor composition during atomization, if necessary, to keep the concentration of precursor components substantially constant during atomization.

The size of the aerosol droplets can vary depending on the atomization technique. In one embodiment, the average droplet size is not greater than about 10 µm and more preferably is not greater than about 5 µm. Large droplets can be optionally removed from the aerosol, such as by the use of an impactor.

Low aerosol concentrations require large volumes of flow gas and can be detrimental to the deposition of fine features. The concentration of the aerosol scan optionally be increased, such as by using a virtual impactor. The concentration of the aerosol can be greater than about $10^6$ droplets/cm$^3$ and more preferably is greater than $10^7$ droplets/cm$^3$. The concentration of the aerosol can be monitored and the information can be used to maintain the mist concentration within, for example, 10% of the desired mist concentration over a period of time.

The droplets are deposited onto the surface of the substrate by inertial impaction of larger droplets, electrostatic deposition of charged droplets, diffusional deposition of sub-micron droplets, interception onto non-planar surfaces and settling of droplets, such as those having a size in excess of about 10 µm.

Examples of tools and methods for the deposition of fluids using aerosol jet deposition include U.S. Pat. No. 6,251,488 by Miller et al., U.S. Pat. No. 5,725,672 by Schmitt et al. and U.S. Pat. No. 4,019,188 by Hochberg et al. Each of these U.S. patents is incorporated herein by reference in their entirety.

The precursor compositions of the present invention can also be deposited by a variety of other techniques including intaglio, roll printer, spraying, dip coating, spin coating, and other techniques that direct discrete units of fluid or continuous jets, or continuous sheets of fluid to a surface. Other printing methods include lithographic and gravure printing.

For example, gravure printing can be used with precursor compositions having a viscosity of up to about 5000 centipoise. The gravure method can deposit features having an average thickness of from about 1 µm to about 25 µm micrometers and can deposit such features at a high rate of speed, such as up to about 700 meters per minute. The gravure process also enables the direct formation of patterns onto the surface.

Lithographic printing methods can also be utilized. In the lithographic process, the inked printing plate contacts and transfers a pattern to a rubber blanket and the rubber blanket contacts and transfers the pattern to the surface being printed. A plate cylinder first comes into contact with dampening rollers that transfer an aqueous solution to the hydrophilic non-image areas of the plate. A dampened plate then contacts an inking roller and accepts the ink only in the oleophilic image areas.

Using one or more of the foregoing deposition techniques, it is possible to deposit the precursor composition on one side or both sides of a substrate. Further, the processes can be repeated to deposit multiple layers of the same or different precursor compositions on a substrate.

An optional first step, prior to deposition of the precursor composition, is surface modification of the substrate as is discussed above. The surface modification can be applied to the entire substrate or can be applied in the form of a pattern, such as by using photolithography. The surface modification can include increasing or decreasing the hydrophilicity of the substrate surface by chemical treatment. For example, a silanating agent can be used on the surface of a glass substrate to increase the adhesion and/or to control spreading of the precursor composition through modification of the surface tension and/or wetting angle. The surface modification can also include the use of a laser to clean the substrate. The surface can also be subjected to mechanical modification by contacting with another type of surface. The substrate can also be modified by corona treatment. For the deposition of organic-based precursor compositions, the activation energy of the substrate surface can be modified.

For example, a line of polyimide can be printed prior to deposition of a precursor composition, such as a silver metal precursor composition, to prevent infiltration of the composition into a porous substrate, such as paper. In another example, a primer material may be printed onto a substrate to locally etch or chemically modify the substrate, thereby inhibiting the spreading of the precursor composition being deposited in the following printing step. In yet another example, a via can be etched by printing a dot of a chemical that is known to etch the substrate. The via can then be filled in a subsequent printing process to connect circuits being printed on the front and back of the substrate.

As is discussed above, the deposition of the low viscosity precursor composition can be carried out by pen/syringe, continuous or drop on demand ink-jet, droplet deposition, spraying, flexographic printing, lithographic printing, gravure printing, other intaglio printing, and others. The precursor composition can also be deposited by dip-coating or spin-coating, or by pen dispensing onto a rod or fiber type substrates with the same composition. Immediately after deposition, the composition may spread, draw in upon itself, or form patterns depending on the surface modification discussed above. In another embodiment a method is provided for processing the deposited composition using 2 or more jets or other ink sources. In one embodiment, the first deposition step provides the precursor composition including a molecular metal precursor compound while the second deposition step provides a reducing agent or other co-reactant that converts the precursor and/or reduces the conversion temperature. Another example of a method for processing the deposited composition is using infiltration into a porous bed formed by a previous fabrication method. Another method for depositing the composition is using multi-pass deposition to build the thickness of the deposit. Another example of a method for depositing the composition is using a heated head to decrease the viscosity of the composition.

The properties of the deposited precursor composition can also be subsequently modified. This can include freezing, melting and otherwise modifying the properties such as viscosity with or without chemical reactions or removal of material from the precursor composition. For example, a low viscosity precursor composition including a UV-curable polymer can be deposited and immediately exposed to an ultraviolet lamp to polymerize and thicken and reduce spreading of the composition. Similarly, a thermoset polymer can be deposited and exposed to a heat lamp or other infrared light source. After deposition, the precursor composition is treated in one or more steps to convert the metal precursor and obtain the desired final properties of the deposited feature.

After deposition, the precursor composition is treated to convert the precursor composition to the conductive feature. The treatment can include multiple steps, or can occur in a single step, such as when the precursor composition is rapidly heated and held at the conversion temperature for a sufficient amount of time to form the conductive feature.

An optional, initial step can include drying or subliming of the composition by heating or irradiating. In this step, material is removed from the composition and/or chemical reactions occur in the composition. An example of a method for processing the deposited composition in this manner is using a UV, IR, laser or a conventional light source. Heating rates for drying the precursor composition are preferably greater than about 10° C./min, more preferably greater than 100° C./min and even more preferably greater than 1000° C./min. The temperature of the deposited precursor composition can be raised using hot gas or by contact with a heated substrate. This temperature increase may result in further evaporation of solvents and other species. A laser, such as an IR laser, can also be used for heating. IR lamps or a belt furnace can also be utilized. It may also be desirable to control the cooling rate of the deposited feature.

After drying, the next step is to react the molecular metal precursors. In one embodiment, the precursor composition is reacted using various gases to assist in the conversion of the precursor composition to a conductive feature. For example, hydrogen, nitrogen, and reducing gases can be used to assist the reaction. Copper, nickel, and other metals that oxidize when exposed to oxygen may require the presence of reducing atmospheres. It has been found that the precursor compositions of the present invention can advantageously provide very short reaction times when processed with light (e.g., a laser) that heats the materials. This is a result of the high chemical reaction rates when sufficiently high temperatures are provided for a specific precursor and the ability of light to rapidly heat the materials over time scales of milliseconds or even less. In the case of precursor compositions including particles, phases having a low melting or softening point allow short processing times.

The precursor compositions of the present invention can be processed for very short times and still provide useful materials. Short heating times can advantageously prevent damage to the underlying substrate. Preferred thermal processing times for deposits having a thickness on the order of about 10 μm are not greater than about 100 milliseconds, more preferably not greater than about 10 milliseconds, more preferably not greater than about 1 millisecond. The short heating times can be provided using laser (pulsed or continuous wave), lamps, or other radiation. Particularly preferred are scanning lasers with controlled dwell times. When processing with belt and box furnaces or lamps, the hold time is preferably not greater than 60 seconds, and more preferably not greater than 30 seconds, and even more preferably not greater than 10 seconds. The heating time can even be not greater than 1 second when processed with these heat sources, and even not greater than 0.1 second while still providing conductive materials that are useful in a variety of applications. The preferred heating time and temperature will also depend on the nature of the electronic feature. It will be appreciated that short heating times may not be beneficial if the solvent or other constituents boil rapidly and form porosity or other defects in the feature.

When used to form conductors the deposited precursor compositions can be substantially fully converted at temperatures of not greater than 300° C., more preferably not greater than 250° C., more preferably not greater than 225° C., even more preferably not greater than 200° C., and even more preferably not greater than 185° C.

The particles in the precursor composition (if any) or the material derived from the precursor can optionally be sintered subsequent to decomposition of the metal precursor. The sintering can be carried out using furnaces, light sources such as heat lamps and/or lasers. In one embodiment, the use of a laser advantageously provides very short sintering times and in one embodiment the sintering time is not greater than 1 second, more preferably not greater than 0.1 seconds and even more preferably not greater than 0.01 seconds. Laser types include pulsed and continuous wave. In one embodiment, the laser pulse length is tailored to provide a depth of heating that is equal to the thickness of the material to be sintered. The components in the precursor composition can be fully or partially reacted before contact with laser light. The components can be reacted by exposure to the laser light and then sintered.

The conductive feature can be post-treated after deposition and conversion of the metal precursor. For example, the crystallinity of the phases present can be increased, such as by laser processing. The post-treatment can also include cleaning and/or encapsulation of the electronic features, or other modifications.

It will be appreciated from the foregoing discussion that two or more of the latter process steps (drying, heating, reacting and sintering) can be combined into a single process step.

One preferred process flow includes the steps of: forming a structure by conventional methods such as lithographic, gravure, flexo, screen printing, photo patterning, thin film or wet subtractive approaches; identifying locations requiring addition of material; adding material by a direct deposition of a low viscosity composition; and processing to form the final product. In a specific embodiment, a circuit is prepared by screen-printing and is then repaired by localized printing of a low viscosity precursor composition.

More specifically, the present invention provides a method for the repair of a feature by ink-jet printing or syringe dispensing. In one embodiment, the method includes the steps of ink-jet printing a precursor composition onto a repair region and heating to temperatures sufficient to convert the precursor composition to a substantially pure conductor. According to one embodiment of the present invention, the repair feature is a ball grid array (BGA). According to another embodiment, the feature is a circuit pattern in a low temperature cofire ceramic (LTCC) layer. In one embodiment, the pattern is not yet sintered while in another embodiment the pattern is already sintered. In one embodiment, a laser can be used to heat the repair section. The repair can be carried out prior to processing of the part. The repair can be made to a metallic conductor or other electronic feature. The repaired portion can have been formed by screen-printing or photopatterning of a particle-containing composition. In one embodiment, laser trimming is used to further define the repair region after ink-jet deposition.

According to one embodiment of the present invention, the repaired feature preferably has a minimum feature size that is not greater than about 250 μm and more preferably is not greater than about 100 μm. According to one embodiment, the repaired feature has a minimum feature size not greater than about 10 μm. The repair can be made to features derived from various processes such as chemical vapor deposition, evaporation, sputtering or other thin film techniques.

In another embodiment, features larger than approximately 100 μm are first prepared by screen-printing. Features not greater than about 100 μm are then deposited by a direct deposition method using a low viscosity precursor composition.

In yet another embodiment, a polyimide surface is first modified to promote adhesion of the low viscosity precursor composition. The precursor composition is deposited, and then is dried and converted at a temperature of not greater than 300° C. After deposition and conversion, the feature can then optionally be laser sintered.

Preferably, the conductive feature has a resistivity that is not greater than 10 times the bulk resistivity of the metal, preferably not greater than 6 times the bulk resistivity, more preferably not greater than 4 times the bulk resistivity and most preferably not greater than 2 times the bulk resistivity of the metal.

According to the present invention, the low viscosity precursor composition can be deposited, dried, and reacted with a total reaction time of not greater than about 100 seconds, more preferably not greater than about 10 seconds and even more preferably not greater than about 1 second.

In yet another embodiment, the low viscosity precursor composition can be deposited, dried, and reacted, wherein the total time for deposition, drying and reaction is not greater than about 1 minute, more preferably not greater than about 10 seconds and even more preferably not greater than about 1 second.

The product compositions derived from the printed low viscosity precursor compositions of the present invention can include a variety of material combinations.

In one embodiment, a conductive feature comprises silver and copper. In a preferred embodiment, the feature includes discrete regions of copper metal that are derived from particles, preferably particles having an average size of not greater than 1 μm. According to this embodiment, the copper metal is dispersed in a matrix of silver that is derived from a molecular metal precursor. The silver and copper are not substantially interdiffused as when derived from high fire compositions. In one embodiment, the feature includes about 85 vol. % copper and 15 vol. % silver. In another embodiment, the silver derived from the precursor also includes an amount of copper, palladium, platinum or some other metal that provides resistance to electromigration or powder solderability.

In another embodiment, the conductive feature includes silver and palladium. In a preferred embodiment, the feature includes regions of substantially pure dispersed silver in a matrix of silver-palladium that provides resistance to solder leaching. In a particularly preferred embodiment, the silver-palladium is derived from precursors and the overall feature includes not greater than about 2 vol. % palladium, more preferably not greater than about 1 vol. % palladium. In another embodiment, the palladium is replaced with another metal derived from a precursor to provide a silver matrix that includes an amount of copper, platinum or some other metal that provides resistance to electromigration or solder leaching.

In yet another embodiment, the feature comprises silver or copper derived from a precursor and an insulating phase. The insulating phase is preferably a glass or metal oxide. Preferred glasses are aluminum borosilicates, lead borosilicates and the like. Preferred metal oxides are silica, titania, alumina, and other simple and complex metal oxides. The insulating phase can be derived from particles or precursors. This embodiment is particularly useful for the production of low ohm resistors.

In an embodiment preferred for transparent and conducting materials, zinc oxide, antimony tin oxide (ATO), indium tin oxide (ITO) and mixtures of these are contained in a feature. In a preferred embodiment, the feature comprises a small amount of metal to improve the conductivity while only slightly degrading conductivity by choosing processing conditions to provide metal regions not greater than about 100 nanometers in size.

The conductor composition can also be a composite of dissimilar materials. The composite can include metal-metal oxide, metal-polymer, metal-glass, carbon-metal, and other combinations. The conductor composition can also include solder-like compositions. The composition can include silver, lead, tin, indium, copper, and other elements.

In accordance with the foregoing direct-write processes, the present invention enables the formation of features for devices and components having a small minimum feature size. For example, the method of the present invention can be used to fabricate features having a minimum feature size (the smallest feature dimension in the x-y axis) of not greater than about 100 μm, more preferably not greater than about 75 μm, even more preferably not greater than about 50 μm and even more preferably greater than 25 μm. The minimum feature size can even be not greater than about 10 μm and even not greater than about 5 μm. These feature sizes can be provided using ink-jet printing and other printing approaches that provide droplets or discrete units of low viscosity composition to a surface. The small feature sizes can advantageously be applied to various components and devices, as is discussed below.

Conductor Properties and Structure

The conductors formed by the present invention have combinations of various features that have not been attained using other low viscosity precursors. The conductive features preferably have a high purity, a high electrical conductivity and high electromigration resistance. High conductivity can be provided through the low viscosity compositions comprising precursors to silver, platinum, palladium, gold, nickel or copper.

The present invention is particularly useful for fabrication of conductors with resistivities that are not greater than 20 times the resistivity of the substantially pure bulk conductor, more preferably not greater than 10 times the substantially pure bulk conductor, even more preferably not greater than 6 times and most preferably not greater than 2 times that of the substantially pure bulk conductor.

However, it will be appreciated that the properties of the conductive feature can vary depending upon the particular application. For example, it may be desirable for some applications to process the feature at a very low temperature where low resistivity is not a major factor. According to one embodiment, a precursor composition can be deposited and converted at a temperature of not greater than 125° C., where the resistivity of the feature is not greater than about 200 times the resistivity of the pure bulk conductor, more preferably not greater than about 100 times the resistivity of the bulk conductor and even more preferably not greater than about 80 times the resistivity of the bulk conductor.

After heating, the compositions of the present invention will yield solids with specific bulk resistivity values. As a background, bulk resistivity values of a number of solids are provided in Table 8.

TABLE 8

Bulk Resistivity of Various Materials

| Material | Bulk Resistvity (micro-Ω cm) |
|---|---|
| silver (Ag - thick film material fired at 850° C.) | 1.59 |
| copper (Cu) | 1.68 |
| gold (Au) | 2.24 |
| aluminum (Al) | 2.64 |
| Ferro CN33-246 (Ag + low melting glass, fired at 150° C.) | 2.7-3.2 |
| SMP Ag flake + precursor formulation, 250° C. | 4.5 |
| molybdenum (Mo) | 5.2 |
| Tungsten (W) | 5.65 |
| zinc (Zn) | 5.92 |
| nickel (Ni) | 6.84 |
| iron (Fe) | 9.71 |
| palladium (Pd) | 10.54 |
| tin (Sn) | 11 |
| solder (Pb—Sn; 50:50) | 15 |
| Lead | 20.64 |
| Titanium nitrate (TiN transparent conductor) | 20 |
| duPont Polymer Thick Film 5029 (state of the art Ag filled polymer, 150° C.) | 18-50 |
| duPont Polymer Thick Film (Cu filled polymer) | 75-300 |
| ITO indium tin oxide ($In_2O_3$:Sn) | 100 |
| zinc oxide (ZnO doped-undoped) | 120-450 |
| carbon (C-graphite) | 1375 |
| KIA SCC-10 (doped silver phosphate glass, 330° C. soft point) | 3000 |
| ruthenium oxide $RuO_2$ type conductive oxides | 5000-10,000 |
| Bayer conductive polymer Baytron-P | 1,000,000 |

According to one embodiment of the present invention, a low viscosity precursor composition includes up to about 20 volume percent micron-size metal particles and from about 10 to about 15 weight percent of a molecular metal precursor with the balance being vehicle and other additives. After heating at between 200° C. and 300° C., the feature can have a bulk conductivity in the range from 1 to 5 times the bulk metal conductivity.

According to another embodiment of the present invention, a low viscosity precursor composition includes up to about 20 volume percent micron-size metal particles, with the balance being a vehicle containing a precursor to a conductive polymer. After heating at between 100° C. and 200° C., the feature can have a bulk conductivity in the range from 5 to 50 times the bulk conductivity of the metal phase.

According to another embodiment of the present invention, a transparent conductor ink formulation includes about 15 vol. % micron-size particles selected from the group of ITO, ATO, ZnO, SnO$_2$, and 5 vol. % Ag nanoparticles, and between 0 and 20 weight percent precursor to Ag with the balance being solvents, vehicle and other additives. After firing at between 250° C. and 400° C. the feature can have a bulk conductivity in the range from 500 to 1000 micro-ohm-centimeter.

A transparent conductor ink formulation includes up to about 30 vol. % micron-size particles selected from the group of ITO, ATO, ZnO, SnO$_2$, and between 5 and 40 weight percent precursor to Ag, with the balance being solvents, vehicle and other additives. After firing at between 150° C. and 300° C., the feature can have a conductivity in the range from 500 to 1000 micro-ohm-centimeter.

According to another embodiment of the present invention, a transparent conductor ink formulation includes up to about 15 vol. % micron-size particles selected from the group of ITO, ATO, ZnO, SnO$_2$, and up to 10 vol. % conductive glass particles such as silver phosphate glass, and between 0 and 20 weight percent precursor to Ag, with the balance being solvents, vehicle and other additives. After firing at between 300° C. and 500° C., the feature can have a bulk conductivity in the range from 300 to 800 micro-ohm-centimeter.

According to another embodiment of the present invention, a low cost conductor precursor composition includes between 5 and 20 vol. % micron-size particles selected from the group of amorphous carbon, carbon graphite, iron, nickel, tungsten, molybdenum, and between 0 and 5 vol. % nanoparticles selected from the group of Ag, carbon, intrinsically conductive polymer, Fe, Cu, Mo, W, and between 0 and 20 weight percent precursor to a metal such as Ag, with the balance being solvents, vehicle and other additives. After heating at between 250° C. and 400° C., the feature can have a bulk conductivity in the range from 100 to 4000 micro-ohm-centimeter.

According to another embodiment of the present invention, a low cost conductor precursor composition includes between 5 and 20 vol % micron-size particles selected from the group of amorphous carbon, graphite, iron, nickel, tungsten, molybdenum, and between 20 and 50 weight percent precursor to an intrinsically conductive polymer, with the balance being solvents, vehicle and other additives. After heating at between 100° C. and 200° C., the feature can have a bulk conductivity in the range from 5,000 to 15,000 micro-ohm-centimeter.

The silver-palladium compositions of the present invention can also provide resistance to solder leaching. In one embodiment, the compositions provide resistance to 3 dips in standard 60/40 lead-tin solder at its melting point.

The compositions and methods of the present invention advantageously allow the fabrication of various unique structures.

In one embodiment, the average thickness of the deposited feature is greater than about 0.01 µm, more preferably is greater than about 0.05 µm, even more preferably is greater than about 0.1 µm and even more preferably is greater than about 0.5 µm. The thickness can even be greater than about 1 µm, such as greater than about 5 µm. These thicknesses can be obtained by ink-jet deposition or deposition of discrete units of material by depositing more than a single layer. A single layer can be deposited and dried, followed by repetitions of this cycle.

Vias can also be filled with the low viscosity precursor compositions of the present invention. The via can be filled, dried to remove the volume of the solvent, filled further and two or more cycles of this type can be used to fill the via. The via can then be processed to convert the material to its final composition. After conversion, it is also possible to add more precursor composition, dry and then convert the material to product to replace the volume of material lost upon conversion to the final product.

The compositions and methods of the present invention can also be used to form dots, squares and other isolated regions of material. The regions can have a minimum feature size of not greater than 250 µm, such as not greater than 100 µm, and even not greater than 50 µm, such as not greater than 25 µm and even not greater than 10 µm. These features can be deposited by ink-jet printing of a single droplet or multiple droplets at the same location with or without drying in between deposition of droplets or periods of multiple droplet deposition. In one embodiment, the surface tension of the precursor composition on the substrate material is chosen to provide poor wetting of the surface so that the composition contracts onto itself after printing. This provides a method for producing deposits with sizes equal to or smaller than the droplet diameter.

The compositions and methods of the present invention can also be used to form lines. In one embodiment, the lines can advantageously have an average width of not greater than 250 µm, such as not greater than 100 µm, and even not greater than 50 µm.

The compositions and methods of the present invention produce features that have good adhesion to the substrates on which they are formed. For example, the conductive features will adhere to the substrate with a peel strength of at least 10 newtons/cm. Adhesion can be measured using the scotch-tape test, wherein scotch-tape is applied to the feature and is pulled perpendicular to the plane of the trace and the substrate. This applies a force of about 10 N/cm. A passing measure is when little or no residue from the feature remains on the tape.

Applications

The low viscosity precursor compositions and methods of the present invention can advantageously be used in a variety of applications. The following is a non-limiting description of the types of devices and components to which the methods and compositions of the present invention are applicable.

The compositions and methods of the present invention can be used to fabricate transparent antennas for RF (radio frequency) tags and smart cards. This is enabled by compositions comprising a transparent conductive metal oxide such as ITO. In another embodiment, the compositions can include some metal to enhance conductivity. In one embodiment, the antenna comprises a material with a sheet resistivity of from about 10 to 100,000 ohms/square. In another embodiment, the antenna comprises a conductor with a resistivity that is not greater than three times the resistivity of substantially pure silver. High conductivity traces are required for inductively coupled antennas whereas conductive metal oxides can be used for electrostatic (capacitively coupled) antennas.

The compositions can also serve as solder replacements. Such compositions can include silver, lead or tin.

The compositions and methods can be utilized to provide connection between chips and other components in smart cards and RF tags.

In one embodiment, the surface to be printed onto is not planar and a non-contact printing approach is used. The non-contact printing approach can be ink-jet printing or another technique providing deposition of discrete units of fluid onto the surface. Examples of surfaces that are non-planar include windshields, electronic components, electronic packaging and visors.

The compositions and methods provide the ability to print disposable electronics such as for games included in magazines. The compositions can advantageously be deposited and reacted on cellulose-based materials such as paper or cardboard. The cellulose-based material can be coated if necessary to prevent bleeding of the precursor composition into the substrate. For example, the cellulose-based material could be coated with a UV curable polymer.

The compositions and methods can be used to form under-bump metallization, redistribution patterns and basic circuit components.

The compositions and processes of the present invention can also be used to fabricate microelectronic components such as multichip modules, particularly for prototype designs or low-volume production Another technology where the direct-write deposition of electronic features according to the present invention provides significant advantages is for flat panel displays, such as plasma display panels. Ink-jet deposition of electronic powders is a particularly useful method for forming the electrodes for a plasma display panel. The electronic powders and deposition method according to the present invention can advantageously be used to form the electrodes, as well as the bus lines and barrier ribs, for the plasma display panel. Typically, a metal paste is printed onto a glass substrate and is fired in air at from about 450° C. to 600° C. Direct-write deposition of low viscosity precursor compositions offers many advantages over paste techniques including faster production time and the flexibility to produce prototypes and low-volume production applications. The deposited features will have high resolution and dimensional stability, and will have a high density.

Another type of flat panel display is a field emission display (FED). The deposition method of the present invention can advantageously be used to deposit the microtip emitters of such a display. More specifically, a direct-write deposition process such as an ink-jet deposition process can be used to accurately and uniformly create the microtip emitters on the backside of the display panel.

Another type of electronic powder to which the present invention is applicable is transparent electrode powder, particularly indium-tin oxide, referred to as ITO. Such materials are used as electrodes in display applications, particularly for thin-film electroluminescent (TFEL) displays. The electrode patterns of ITO can advantageously be deposited using the direct-write method of the present invention including an ink-jet, particularly to form discrete patterns of indicia, or the like.

The present invention is also applicable to inductor-based devices including transformers, power converters and phase shifters. Examples of such devices are illustrated in: U.S. Pat. No. 5,312,674 by Haertling et al.; U.S. Pat. No. 5,604,673 by Washburn et al.; and U.S. Pat. No. 5,828,271 by Stitzer. Each of the foregoing U.S. patents is incorporated herein by reference in their entirety. In such devices, the inductor is commonly formed as a spiral coil of an electrically conductive trace, typically using a thick-film paste method. To provide the most advantageous properties, the metalized layer, which is typically silver, must have a fine pitch (line spacing). The output current can be greatly increased by decreasing the line width and decreasing the distance between lines. The direct-write process of the present invention is particularly advantageous for forming such devices, particularly when used in a low-temperature cofired ceramic package (LTCC).

The present invention can also be used to fabricate antennas such as antennas used for cellular telephones. The design of antennas typically involves many trial and error iterations to arrive at the optimum design. The direct-write process of the present invention advantageously permits the formation of antenna prototypes in a rapid and efficient manner, thereby reducing a product development time. Examples of microstrip antennas are illustrated in: U.S. Pat. No. 5,121,127 by Toriyama; U.S. Pat. No. 5,444,453 by Lalezari; U.S. Pat. No. 5,767,810 by Hagiwara et al.; and U.S. Pat. No. 5,781,158 by Ko et al. Each of these U.S. patents is incorporated herein by reference in their entirety. The methodology of the present invention can be used to form the conductors of an antenna assembly.

The precursor compositions and methods of the present invention can also be used to apply underfill materials that are used below electronic chips to attach the chips to surfaces and other components. Hollow particles are particularly advantageous because they are substantially neutrally buoyant. This allows the particles to be used in underfill applications without settling of the particles in the liquid between the chip and surface below. Further, the spherical morphology of the particles allows them to flow better through the small gap. This significantly reduces the stratification that is often observed with dense particles. Further, very high thermal conductivity is not required and therefore silica is often used in this application. In other applications, the material must be thermally conductive but not electrically conductive. Materials such as boron nitride (BN) can then be used.

Additional applications enabled by the low viscosity precursor compositions and deposition methods of the present invention include low cost or disposable electronic devices such as electronic displays, electrochromic, electrophoretic and light-emitting polymer-based displays. Other applications include circuits imbedded in a wide variety of devices such as low cost or disposable light-emitting diodes, solar cells, portable computers, pagers, cell phones and a wide variety of internet compatible devices such as personal organizers and web-enabled cellular phones. The present invention also enables a wide variety of security and authentication applications. For example, with the advent and growth of desktop publishing and color-photocopiers, the opportunities for document and coupon fraud have increased dramatically. The present invention has utility in a variety of areas including coupon redemption, inventory security, currency security, compact disk security and driver's license and passport security. The present invention can also be utilized as an effective alternative to magnetic strips. Presently, magnetic strips include identification numbers such as credit card numbers that are programmed at the manufacturer. These strips are prone to failure and are subject to fraud because they are easily copied or modified. To overcome these shortcomings, circuits can be printed on the substrate and encoded with specific consumer information. Thus, the present invention can be used to improve the security of credit cards, ATM cards and any other tracking card, which uses magnetic strips as a security measure.

The compositions and methods of the present invention can also produce conductive patterns that can be used in flat panel displays. The conductive materials used for electrodes in display devices have traditionally been manufactured by commercial deposition processes such as etching, evaporation, and sputtering onto a substrate. In electronic displays it is often necessary to utilize a transparent electrode to ensure that the display images can be viewed. Indium tin oxide (ITO), deposited by means of vacuum-deposition or a sputtering process, has found widespread acceptance for this application. U.S. Pat. No. 5,421,926 by Yukinobu et al. discloses a process for printing ITO inks. For rear electrodes (i.e., the electrodes other than those through which the display is viewed) it is often not necessary to utilize transparent conductors. Rear electrodes can therefore be formed from conventional materials and by conventional processes. Again, the rear electrodes have traditionally been formed using costly sputtering or vacuum deposition methods. The compositions according to the present invention allow the direct deposition of metal electrodes onto low temperature substrates such as plastics. For example, a silver precursor composition can be ink-jet printed and heated at 150° C. to form 150 μm by 150 μm square electrodes with excellent adhesion and sheet resistivity values of less than 1 ohms per square.

In one embodiment, the precursor compositions are used to interconnect electrical elements on a substrate, such as non-linear elements. Non-linear elements are defined herein as electronic devices that exhibit nonlinear responses in relationship to a stimulus. For example a diode is known to exhibit a nonlinear output-current/input-voltage response. An electroluminescent pixel is known to exhibit a non-linear light-output/applied-voltage response. Nonlinear devices also include but are not limited to transistors such as TFTs and OFETs, emissive pixels such as electroluminescent pixels, plasma display pixels, field emission display (FED) pixels and organic light emitting device (OLED) pixels, non emissive pixels such as reflective pixels including electrochromic material, rotatable microencapsulated microspheres, liquid crystals, photovoltaic elements, and a wide range of sensors such as humidity sensors.

Nonlinear elements, which facilitate matrix addressing, are an essential part of many display systems. For a display of M×N pixels, it is desirable to use a multiplexed addressing scheme whereby M column electrodes and N row electrodes are patterned orthogonally with respect to each other. Such a scheme requires only M+N address lines (as opposed to M×N lines for a direct-address system requiring a separate address line for each pixel). The use of matrix addressing results in significant savings in terms of power consumption and cost of manufacture. As a practical matter, the feasibility of using matrix addressing usually hinges upon the presence of a non-linearity in an associated device. The nonlinearity eliminates crosstalk between electrodes and provides a thresholding function. A traditional way of introducing nonlinearity into displays has been to use a backplane having devices that exhibit a nonlinear current/voltage relationship. Examples of such devices include thin-film transistors (TFT) and metal-insulator-metal (MIM) diodes. While these devices achieve the desired result, they involve thin-film processes, which suffer from high production costs as well as relatively poor manufacturing yields.

The present invention allows the direct printing of the conductive components of nonlinear devices including the source the drain and the gate. These nonlinear devices may include directly printed organic materials such as organic field effect transistors (OFET) or organic thin film transistors (OTFT), directly printed inorganic materials and hybrid organic/inorganic devices such as a polymer based field effect transistor with an inorganic gate dielectric. Direct printing of these conductive materials will enable low cost manufacturing of large area flat displays.

The compositions and methods of the present invention produce conductive patterns that can be used in flat panel displays to form the address lines or data lines. The lines may be made from transparent conducting polymers, transparent conductors such as ITO, metals or other suitable conductors. The present invention provides ways to form address and data lines using deposition tools such as an ink-jet device. The precursor compositions of the present invention allow printing on large area flexible substrates such as plastic substrates and paper substrates, which are particularly useful for large area flexible displays. Address lines may additionally be insulated with an appropriate insulator such as a non-conducting polymer or other suitable insulator. Alternatively, an appropriate insulator may be formed so that there is electrical isolation between row conducting lines, between row and column address lines, between column address lines or for other purposes. These lines can be printed with a thickness of about one μm and a line width of 100 μm by ink-jet printing the precursor composition. These data lines can be printed continuously on large substrates with an uninterrupted length of several meters. Surface modification can be employed, as is discussed above, to confine the composition and to enable printing of lines as narrow as 10 μm. The deposited lines can be heated to 200° C. to form metal lines with a bulk conductivity that is not less than 10 percent of the conductivity of the equivalent pure metal.

Flat panel displays may incorporate emissive or reflective pixels. Some examples of emissive pixels include electroluminescent pixels, photoluminescent pixels such as plasma display pixels, field emission display (FED) pixels and organic light emitting device (OLED) pixels. Reflective pixels include contrast media that can be altered using an electric field. Contrast media may be electrochromic material, rotatable microencapsulated microspheres, polymer dispersed liquid crystals (PDLCs), polymer stabilized liquid crystals, surface stabilized liquid crystals, smectic liquid crystals, ferroelectric material, or other contrast media well known in art. Many of these contrast media utilize particle-based non-emissive systems. Examples of particle-based non-emissive systems include encapsulated electrophoretic displays (in which particles migrate within a dielectric fluid under the influence of an electric field); electrically or magnetically driven rotating-ball displays as disclosed in U.S. Pat. Nos. 5,604,027 and 4,419,383, which are incorporated herein by reference in their entirety; and encapsulated displays based on micromagnetic or electrostatic particles as disclosed in U.S. Pat. Nos. 4,211,668, 5,057,363 and 3,683,382, which are incorporated herein by reference in their entirety. A preferred particle non-emissive system is based on discrete, microencapsulated electrophoretic elements, examples of which are disclosed in U.S. Pat. No. 5,930,026 by Jacobson et al. which is incorporated herein by reference in its entirety.

In one embodiment, the present invention relates to directly printing conductive features, such as electrical interconnects and electrodes for addressable, reusable, paper-like visual displays. Examples of paper-like visual displays include "gyricon" (or twisting particle) displays and forms of electronic paper such as particulate electrophoretic displays (available from E-ink Corporation, Cambridge, Mass.). A gyricon display is an addressable display made up of optically anisotropic particles, with each particle being selectively rotatable to present a desired face to an observer. For example, a gyricon display can incorporate "balls" where each ball has two distinct hemispheres, one black and the other white. Each hemisphere has a distinct electrical characteristic (e.g., zeta potential with respect to a dielectric fluid) so that the ball is electrically as well as optically anisotropic. The balls are electrically dipolar in the presence of a dielectric, fluid and are subject to rotation. A ball can be selectively rotated within its respective fluid-filled cavity by application of an electric field, so as to present either its black or white hemisphere to an observer viewing the surface of the sheet.

In another embodiment, the present invention relates to electrical interconnects and electrodes for organic light emitting displays (OLEDs). Organic light emitting displays are emissive displays consisting of a transparent substrate coated with a transparent conducting material (e.g., ITO), one or more organic layers and a cathode made by evaporating or sputtering a metal of low work function characteristics (e.g., calcium or magnesium). The organic layer materials are chosen so as to provide charge injection and transport from both electrodes into the electroluminescent organic layer (EL), where the charges recombine to emit light. There may be one or more organic hole transport layers (HTL) between the transparent conducting material and the EL, as well as one or more electron injection and transporting layers between the cathode and the EL. The precursor compositions according to the present invention allow the direct deposition of metal electrodes onto low temperature substrates such as flexible large area plastic substrates that are particularly preferred for OLEDs. For example, a metal precursor composition can be ink-jet printed and heated at 150° C. to form a 150 µm by 150 µm square electrode with excellent adhesion and a sheet resistivity value of less than 1 ohm per square. The compositions and printing methods of the present invention also enable printing of row and column address lines for OLEDs. These lines can be printed with a thickness of about one µm and a line width of 100 µm using ink-jet printing. These data lines can be printed continuously on large substrates with an uninterrupted length of several meters. Surface modification can be employed, as is discussed above, to confine the precursor composition and to enable printing of such lines as narrow as 10 µm. The printed ink lines can be heated to 150° C. and form metal lines with a bulk conductivity that is no less than 5 percent of the conductivity of the equivalent pure metal.

In one embodiment, the present invention relates to electrical interconnects and electrodes for liquid crystal displays (LCDs), including passive-matrix and active-matrix. Particular examples of LCDs include twisted nematic (TN), supertwisted nematic (STN), double supertwisted nematic (DSTN), retardation film supertwisted nematic (RFSTN), ferroelectric (FLCD), guest-host (GHLCD), polymer-dispersed (PD), polymer network (PN).

Thin film transistors (TFTs) are well known in the art, and are of considerable commercial importance. Amorphous silicon-based thin film transistors are used in active matrix liquid crystal displays. One advantage of thin film transistors is that they are inexpensive to make, both in terms of the materials and the techniques used to make them. In addition to making the individual TFTs as inexpensively as possible, it is also desirable to inexpensively make the integrated circuit devices that utilize TFTs. Accordingly, inexpensive methods for fabricating integrated circuits with TFTs, such as those of the present invention, are an enabling technology for printed logic.

For many applications, inorganic interconnects are not adequately conductive to achieve the desired switching speeds of an integrated circuit due to high RC time constants. Printed pure metals, as enabled by the precursor compositions of the present invention, achieve the required performance. A metal interconnect printed by using a silver precursor composition as disclosed in the present invention will result in a reduction of the resistance (R) and an associated reduction in the time constant (RC) by a factor of 100,000, more preferably by 1,000,000, as compared to current conductive polymer interconnect material used to connect polymer transistors.

Field-effect transistors (FETs), with organic semiconductors as active materials, are the key switching components in contemplated organic control, memory, or logic circuits, also referred to as plastic-based circuits. An expected advantage of such plastic electronics is the ability to fabricate them more easily than traditional silicon-based devices. Plastic electronics thus provide a cost advantage in cases where it is not necessary to attain the performance level and device density provided by silicon-based devices. For example, organic semiconductors are expected to be much more readily printable than vapor-deposited inorganics, and are also expected to be less sensitive to air than recently proposed solution-deposited inorganic semiconductor materials. For these reasons, there have been significant efforts expended in the area of organic semiconductor materials and devices.

Organic thin film transistors (TFTs) are expected to become key components in a the plastic circuitry used in display drivers of portable computers and pagers, and memory elements of transaction cards and identification tags. A typical organic TFT circuit contains a source electrode, a drain electrode, a gate electrode, a gate dielectric, an interlayer dielectric, electrical interconnects, a substrate, and semiconductor material. The precursor compositions of the present invention can be used to deposit all the components of this circuit, with the exception of the semiconductor material.

One of the most significant factors in bringing organic TFT circuits into commercial use is the ability to deposit all the components on a substrate quickly, easily and inexpensively as compared with silicon technology (i.e., by reel-to-reel printing). The precursor compositions of the present invention enable the use of low cost deposition techniques, such as ink-jet printing, for depositing these components.

The precursor compositions of the present invention are particularly useful for the direct printing of electrical connectors as well as antennae of smart tags, smart labels, and a wide range of identification devices such as radio frequency identification (RFID) tags. In a broad sense, the conductive precursor compositions can be utilized for electrical connection of semiconductor radio frequency transceiver devices to antenna structures and particularly to radio frequency identification device assemblies. A radio frequency identification device ("RFID") by definition is an automatic identification and data capture system comprising readers and tags. Data is transferred using electric fields or modulated inductive or radiating electromagnetic carriers. RFID devices are becoming more prevalent in such configurations as, for example, smart cards, smart labels, security badges, and livestock tags.

The precursor compositions of the present invention also enable the low cost, high volume, highly customizable production of electronic labels. Such labels can be formed in various sizes and shapes for collecting, processing, displaying and/or transmitting information related to an item in human or machine readable form. The precursor compositions of the present invention can be used to print the conductive features required to form the logic circuits, electronic interconnections, antennae, and display features in electronic labels. The electronic labels can be an integral part of a larger printed item such as a lottery ticket structure with circuit elements disclosed in a pattern as disclosed in U.S. Pat. No. 5,599,046.

In another embodiment of the present invention, the conductive patterns made in accordance with the present invention can be used as electronic circuits for making photovoltaic panels. Currently, conventional screen-printing is used in mass scale production of solar cells. Typically, the top contact pattern of a solar cell consists of a set of parallel narrow finger lines and wide collector lines deposited essentially at a right angle to the finger lines on a semiconductor substrate or wafer. Such front contact formation of crystalline solar cells is performed with standard screen-printing techniques. Direct printing of these contacts with the precursor compositions of the present invention provides the advantages of production simplicity, automation, and low production cost.

Low series resistance and low metal coverage (low front surface shadowing) are basic requirements for the front surface metallization in solar cells. Minimum metallization widths of 100 to 150 μm are obtained using conventional screen-printing. This causes a relatively high shading of the front solar cell surface. In order to decrease the shading, a large distance between the contact lines, i.e., 2 to 3 mm is required. On the other hand, this implies the use of a highly doped, conductive emitter layer. However, the heavy emitter doping induces a poor response to short wavelength light. Narrower conductive lines can be printed using the precursor composition and printing methods of the present invention. The conductive precursor compositions of the present invention enable direct printing of finer features down to 20 μm. The precursor compositions of the present invention further enable the printing of pure metals with resistivity values of the printed features as low as 2 times bulk resistivity after processing at temperatures as low as 200° C.

The low processing and direct-write deposition capabilities according to the present invention are particularly enabling for large area solar cell manufacturing on organic and flexible substrates. This is particularly useful in manufacturing novel solar cell technologies based on organic photovoltaic materials such as organic semiconductors and dye sensitized solar cell technology as disclosed in U.S. Pat. No. 5,463,057 by Graetzel et al. The precursor compositions according to the present invention can be directly printed and heated to yield a bulk conductivity that is no less than 10 percent of the conductivity of the equivalent pure metal, and achieved by heating the printed features at temperatures below 200° C. on polymer substrates such as plexiglass (PMMA).

Another embodiment of the present invention enables the production of an electronic circuit for making printed wiring board (PWBs) and printed circuit boards (PCBs). In conventional subtractive processes used to make printed-wiring boards, wiring patterns are formed by preparing pattern films. The pattern films are prepared by means of a laser plotter in accordance with wiring pattern data outputted from a CAD (computer-aided design system), and are etched on copper foil by using a resist ink or a dry film resist.

In such conventional processes, it is necessary to first form a pattern film, and to prepare a printing plate in the case when a photo-resist ink is used, or to take the steps of lamination, exposure and development in the case when a dry film resist is used.

Such methods can be said to be methods in which the digitized wiring data are returned to an analog image-forming step. Screen-printing has a limited work size because of the printing precision of the printing plate. The dry film process is a photographic process and, although it provides high precision, it requires many steps, resulting in a high cost especially for the manufacture of small lots.

The precursor composition and printing methods of the present invention offer solutions to overcome the limitations of the current PWB formation process. For example, they do not generate any waste. The printing methods of the present invention are a single step direct printing process and are compatible with small-batch and rapid turn around production runs. For example, a copper precursor composition can be directly printed onto FR4 (a polymer impregnated fiberglass) to form interconnection circuitry. These features are formed by heating the printed copper precursor in an $N_2$ ambient at 150° C. to form copper lines with a line width of not greater than 100 μm, a line thickness of not greater than 5 μm, and a bulk conductivity that is not less than 10 percent of the conductivity of the pure copper metal.

Patterned electrodes obtained by one embodiment of the present invention can also be used for screening electromagnetic radiation or earthing electric charges, in making touch screens, radio frequency identification tags, electrochromic windows and in imaging systems, e.g., silver halide photography or electrophotography. A device such as the electronic book described in U.S. Pat. No. 6,124,851 can be formed using the compositions of the present invention.

EXAMPLES

The following examples illustrate the many advantages of the low viscosity precursor compositions according to the present invention. For reference purposes, pure Ag-trifluoroacetate has a normal decomposition temperature of about 325° C. as indicated by thermogravimetric analysis. Pure Ag-acetate decomposes at about 255° C. As used in these examples, thermogravimetric analysis consisted of heating samples (typically 50 milligrams) in air at a heating rate of 10° C./minute and observing the weight loss of the sample.

Example 1

Comparative Example

A silver metal precursor composition containing 50 grams Ag-trifluoroacetate and 50 grams $H_2O$ was formulated. The calculated silver content of the precursor composition was 24.4 wt. % and thermogravimetric analysis showed the mass loss reached 78 wt. % at 340° C. This data corresponds to the above-described decomposition temperature for pure Ag-trifluoroacetate, within a reasonable margin for error.

Example 2

Preferred Additive

A silver precursor composition was formulated containing 44 grams Ag-trifluoroacetate, 22 grams $H_2O$, 33 grams DEGBE and 1 gram lactic acid. The calculated silver content was 21.5 wt. % and thermogravimetric analysis showed the mass loss reached 79 wt. % at 215 EC. The addition of DEGBE as a conversion reaction inducing agent advantageously reduced the conversion temperature by 125 EC compared to the formulation described in Example 1, a decrease of about 34 percent compared to pure Ag-trifluoracetate. The lactic acid functions as a crystallization inhibitor.

Example 3

Comparative Example

A silver precursor composition was formulated containing 58 grams Ag-trifluoroacetate and 42 grams dimethylformamide. The calculated silver content was 21.5 wt. % and thermogravimetric analysis showed a mass loss of 78.5 wt. % at 335 EC, a conversion temperature similar to the formulation in Example 1. This example illustrates that a common solvent (dimethylformamide) had no affect on the conversion temperature of the composition.

Example 4

Preferred Solvent

A silver precursor composition was formulated containing 64.8 grams Ag-trifluoroacetate, 34 grams DMAc and 1.1 grams of a styrene allyl alcohol (SAA) copolymer binder. Thermogravimetric analysis showed that precursor conversion to silver was complete at 275° C. The use of DMAc reduced the conversion temperature by about 65° C. as compared to Example 1.

Example 5

A silver precursor composition was formulated containing 51 grams Ag-trifluoroacetate, 16 grams DMAc and 32 grams alpha-terpineol. The calculated silver content was 25 wt. %. Thermogravimetric analysis showed a mass loss of 77 wt. % at 205 EC. Compared to the composition described in Example 4, which does not employ alpha-terpineol as an additive, the conversion temperature was further reduced by 70° C.

Example 6

A silver precursor composition was formulated containing 33.5 grams Ag-trifluoroacetate, 11 grams DMAc, 2 grams lactic acid and 53.5 grams DEGBE. The calculated silver content was 16.3 wt. %. Thermogravimetric analysis showed a mass loss of 83 wt. % at 205° C. to 215° C. The decomposition temperature is 60° C. to 70° C. lower as compared to the composition described in Example 4, which does not employ DEGBE as an additive in addition to DMAc.

Example 7

A silver precursor composition was formulated containing 49 grams Ag-trifluoroacetate, 16 grams DMAc, 32 grams alpha-terpineol and 1.2 grams Pd-acetate. Thermogravimetric analysis indicated complete conversion of the metal organic precursors at 170° C. This conversion temperature is 35 EC lower as compared to the composition described in Example 5, which does not employ Pd-acetate as a further additive.

Example 8

A silver precursor composition was formulated containing 46 grams Ag-trifluoroacetate, 49 grams DMAc and 2.3 grams Pd-acetate. Thermogravimetric analysis indicated complete conversion of the metal organic precursors at 195° C. This conversion temperature is 80° C. lower compared to the composition described in Example 4, which does not employ Pd-acetate as a further additive.

Example 9

A silver precursor composition was formulated containing 6.8 grams Ag-acetate and 93.1 grams ethanolamine. Thermogravimetric analysis showed that precursor conversion to silver was complete at 190° C. This conversion temperature is 65° C. lower than the conversion temperature of pure Ag-acetate.

Example 10

A silver/palladium precursor composition was formulated containing 8.2 grams Ag-trifluoroacetate, 18.7 grams Pd-trifluoroacetate, 70.2 grams DMAc and 2.8 grams lactic acid. The targeted ratio of Ag/Pd was 40/60 by mass. The calculated Ag/Pd content of the precursor composition was 10 wt. %. Thermogravimetric analysis showed a mass loss of 87 wt. % at 190° C. The presence of Pd-trifluoroacetate reduced the conversion temperature by 80° C. compared to the composition described in Example 4.

Example 11

A silver/palladium precursor composition was formulated containing 5.2 grams Ag-trifluoroacetate, 23.4 grams Pd-trifluoroacetate, 67.9 grams DMAc and 3.5 grams lactic acid. The targeted ratio of Ag/Pd was 25/75 by mass and the calculated Ag/Pd content was 10 wt. %. Thermogravimetric analysis showed a mass loss of 88 wt. % at 190° C. The presence of Pd-trifluoroacetate reduced the conversion temperature by 80 EC compared to the composition described in Example 4.

Example 12

Silver precursor compositions containing various amounts and ratios of Ag-neodecanoate, solvents and additives were formulated. Specific examples are outlined in Table 9. In general, the differences in decomposition temperature are not as pronounced as in formulations containing Ag-trifluoroacetate. Typically, compositions containing Ag-neodecanoate in either DMAc or NMP, together with DEGBE or ethyleneglycolbutylether and/or alpha-terpineol as additives resulted in decomposition temperatures that are between 40° C. and 55° C. lower than pure Ag-neodecanoate. Xylene had no affect on the decomposition temperature of the Ag-neodecanoate.

TABLE 9

Examples Utilizing Ag-Neodecanoate

| RUN | SOLVENT | ADDITIVE 1 | ADDITIVE 2 | DECOMPOSITION TEMPERATURE (° C.) |
|---|---|---|---|---|
| Ag neodecanoate | | | | 265 |
| Ag neodecanoate | Xylene | | | 265 |
| Ag neodecanoate 7.6 × 10$^{-2}$ mole | DMAc 7.9 × 10$^{-2}$ mole | Methoxyethanol 1.45 × 10$^{-2}$ mole | | 250 |
| Ag neodecanoate 1.52 × 10$^{-2}$ mole | Xylene 3.58 × 10$^{-2}$ mole | 1-Butanol 2.67 × 10$^{-2}$ mole | | 250 |
| Ag neodecanoate 7.6 × 10$^{-2}$ mole | DMAc 6.43 × 10$^{-2}$ mole | DEGBE 1.48 × 10$^{-2}$ mole | | 220-230 |
| Ag neodecanoate 2.66 × 10$^{-2}$ mole | DMAc 6.43 × 10$^{-2}$ mole | DEGBE 2.95 × 10$^{-2}$ mole | Alpha-Terpineol 5.19 × 10$^{-2}$ mole | 210-230 |
| Ag neodecanoate 1.14 × 10$^{-2}$ mole | DMAc 2.64 × 10$^{-2}$ mole | DEGBE 3.1 × 10$^{-2}$ mole | EGBE 1.69 × 10$^{-2}$ mole | 225 |
| Ag neodecanoate | DMAc | EGBE | | 240 |

TABLE 9-continued

Examples Utilizing Ag-Neodecanoate

| RUN | SOLVENT | ADDITIVE 1 | ADDITIVE 2 | DECOMPOSITION TEMPERATURE (°C.) |
|---|---|---|---|---|
| 1.14 x 10⁻² mole Ag neodecanoate | 5.05 x 10⁻² mole THF | 2.2 x 10⁻² mole EGBE | | 240 |
| 1.14 x 10⁻² mole Ag neodecanoate | 6.1 x 10⁻² mole Xylene | 2.2 x 10⁻² mole DEGBE | | 230 |
| 1.55 x 10⁻⁵ mole Ag neodecanoate | 2.92 x 10⁻² mole NMP | 1.79 x 10⁻² mole Ethanolamine | | 220 |
| 9.5 x 10⁻² mole Ag neodecanoate | 6.45 x 10⁻² mole THF | 1.8 x 10⁻² mole Methoxyethanol | | 250 |
| 1.5 x 10⁻² mole | 5.27 x 10⁻² mole | 2.89 x 10⁻² mole | | |

Example 13

A gold containing precursor composition was prepared containing 5 grams hydrated gold hydroxide, 15 ml acetic acid and 3 ml trifluoroacetic acid. The mixture was heated to 53° C. for 24 hours until all gold hydroxide had dissolved. The solution was filtered through a microfilter and a clear golden solution of the gold precursor was obtained. Thermogravimetric analysis showed that precursor conversion to gold was complete at 125° C.

Example 14

A gold containing precursor composition was prepared containing 5 grams hydrated gold hydroxide and 18 ml trifluoroacetic acid. The mixture was heated to 53° C. for 3 hours and subsequently stirred at room temperature for 21 hours until all gold hydroxide has dissolved. The solution was filtered through a microfilter and a clear purple solution of the gold precursor was obtained. Thermogravimetric analysis showed that precursor conversion to gold started at room temperature and was complete at a conversion temperature of 90° C.

Example 15

A silver precursor composition was formulated containing 48.1 grams Ag-trifluoroacetate, 48.1 grams DMAc and 3.8 grams DEGBE. The precursor composition was deposited on a glass substrate and fired on a hotplate at 200° C. The resulting film showed large crystal growth and was not conductive. This was believed to be due to crystallization of the Ag-trifluoracetate.

Example 16

A silver precursor composition was formulated containing 48.1 grams Ag-trifluoroacetate, 48.1 grams DMAc and 3.8 grams lactic acid as a crystallization inhibitor. The composition was deposited on a glass substrate and fired on a hotplate at 200° C. The resulting film showed reduced crystal growth, demonstrating the effectiveness of lactic acid as a crystallization inhibitor.

Example 17

A silver precursor composition was formulated containing 33.5 grams Ag-trifluoroacetate, 11.2 grams DMAc, 53.6 grams DEGBE and 1.8 grams lactic acid. The composition was deposited on a polyimide substrate (KAPTON HN, E.I. duPont deNemours Corp., Wilmington, Del.) using an ink-jet device. The resulting film showed severe spreading and formed areas that no longer resembled the original pattern. This example illustrates that additional additives may be necessary to control spreading of the precursor composition.

Example 18

A silver precursor composition was formulated containing 372 grams Ag-trifluoroacetate, 26.7 grams DMAc, 0.9 grams lactic acid, 34.5 grams DEGBE and 0.9 grams SAA to control spreading. The composition was deposited on a polyimide substrate (KAPTON HN) using an ink-jet device. No spreading was observed. After heating in an oven at 250° C. the resulting film showed some shrinkage and had a bulk resistivity of 5.2 times the resistivity of bulk silver.

Example 19

A silver precursor composition was formulated including 21.6 grams Ag-trifluoroacetate, 35.1 grams silver nanoparticles, 21.6 grams ethylene glycol and 21.6 grams water. All weight percentages are relative to the weight of the final composition. The composition was deposited using an ink-jet device and the deposited precursor was heated at 220° C. for 10 minutes to form a conductive trace.

Example 20

A silver precursor composition was formulated including 27.5 grams Ag-trifluoroacetate, 17.7 grams silver nanoparticles, 9.4 grams DMAc, 43.9 grams DEGBE and 1.5 grams lactic acid. The composition was deposited using an ink-jet device and the deposited precursor was heated to 220° C. for 10 minutes to form a conductive trace having a resistivity of not more than about 10 times the resistivity of pure bulk silver.

Precursor Solubility

Solubility of precursor material in a variety of different solvents was tested. Test solutions were prepared by dissolving the precursor in the respective solvent. Small amounts of solid precursor were added incrementally and the solution shaken for 10 to 30 minutes. When the solubility limit was reached by this method the solution was shaken for 12 hours and re-evaluated. This procedure was repeated until additional precursor did not dissolve or precipitation occurred. Solvents tested included water, toluene, xylene, N-methylpyrrolidinone (NMP), alpha-terpineol, N,N-dimethylacetamide (DMAc), N-methylacetamide, nitromethane, diethyleneglycolbutylether (DEGBE), triethyleneglycoldiethylether, methylalcohol, ethyl alcohol, isopropyl alcohol, 1-butyl alcohol, methyl ethyl ketone, acetone, diethylether, tetrahydrofurane, ethanolamine, 3-amino-1-propanol, pyridine, diethylentriamine, tetraethylenediamine, 2-amino-butanol, isopropylaminoethanol.

In general, high solubilities were observed in particular for fluorinated metal carboxylates, mixed carboxylates as well as long chain carboxylates. Preferred solvents for these compounds with regard to solubility are toluene, xylene, N-Methyl pyrrolidinone, tetrahydrofurane and DMAc. Also, some precursors can be successfully dissolved in high amounts in water. A particularly preferred combination consists of silver trifluoroacetate in DMAc where solutions with up to 78 wt. % precursor loading can be achieved.

Example 21

Ratio of Precursor to Reducing Agent

DMAc based silver precursor compositions were formulated containing different ratios of Ag-trifluoroacetate and DEGBE. As illustrated in Table 10 thermogravimetric analysis showed that the higher the ratio of DEGBE to Ag-trifluoroacetate, the lower the conversion temperature to silver. A molar ratio of 1.2—slightly above the stoichiometric ratio of DEGBE to Ag precursor—produces a conversion temperature to silver of 210° C. The use of DEGBE reduced the decomposition temperature by about 65° C. as compared to Example 4, whose data are incorporated in Table 10 for reference, where no DEGBE was used. Smaller ratios of DEGBE to Ag-trifluoroacetate had a decreased effect on lowering the conversion temperature.

TABLE 10

Effect of Ratio of DEGBE to Ag-trifluoroacetate

| DEGBE (pbw) | Ag-trifluoroacetate (pbw) | Conversion temperature (° C.) |
|---|---|---|
| 0 | 40 | 275 |
| 30 | 100 | 285 |
| 38 | 59 | 270 |
| 26.5 | 50 | 245 |
| 38 | 41 | 250 |
| 45 | 46 | 240 |
| 53.5 | 33.5 | 205-215 |

Example 22

Conductivity as Function of Time and Temperature

A precursor composition was formulated containing 37 grams Ag-trifluoroacetate, 34.5 grams DEGBE, 26.7 grams DMAc, 0.9 grams SAA copolymer and 0.9 grams lactic acid and the composition was applied to glass slides to form thin films. These slides were then placed into a preheated oven and heated for controlled lengths of time varying from 1 minute to 60 minutes. The oven was heated to temperatures ranging from 130 EC to 250 EC. As is illustrated in Table 11, the precursor composition formed conductive features at 200° C. after 10 minutes in a convection oven. The numbers listed in Table 11 are the resistivity expressed as a multiple of the resistivity of bulk silver ("no" indicates a complete lack of conductivity). The most conductive features were formed and the most complete conversion occurred at 250° C.

TABLE 11

Resistivity as a Function of Time and Temperature

| Temperature (° C.) | Time (mins) | | | | | | |
|---|---|---|---|---|---|---|---|
| | 1 | 2 | 5 | 7 | 10 | 30 | 60 |
| 130 | No | no | No | no | no | no | no |
| 150 | No | no | No | no | no | no | no |
| 175 | No | no | No | no | no | no | no |
| 200 | No | no | no | no | yes | yes | yes |
| 220 | No | no | no | no | no | yes/no | yes |
| 250 | No | no | 850.5 | 161.8 | 119.3 | 5.2 | 5.8 |

The precursor composition does not form highly conductive features unless exposed to temperatures above 200° C. for a period of time. The highest conductivities are achieved when the composition is exposed to 250° C. for 10 minutes or greater. Thermogravimetric analysis shows that the composition shows complete conversion at about 220° C. Samples that are fired below 200° C. tended to form crystalline deposits caused by evaporation of the solvent before the desired reactions occurred. The formation of crystals is more of a problem in convection ovens due to the mass transfer from the films to the air. This transfer does not occur in a box furnace. The samples heated in the box furnace tend to stay moist longer and not form crystals. The solutions formed elemental silver as shown by x-ray diffraction (XRD) analysis.

The above indicates that one can achieve similar conductivities through heating in an oven, or by any other conventional method by varying either the time or the temperature. If one wishes to achieve a given conductivity all one has to do is fire for a short time at an elevated temperature. If it is desired to fire at lower temperatures one can fire at extended periods of time at a lower temperature. The resulting materials should not differ substantially.

Ink-Jet Deposition of Features

Example 23

A silver precursor composition was formulated comprising 1.2 grams styrene allyl alcohol, 49.2 grams DMAc, 46.2 grams Ag-trifluoroacetate, 1.4 grams lactic acid and 2.1 grams Pd-trifluoroacetate. The composition had a viscosity of 14 centipoise at a shear rate of 66 Hz. The surface tension was 37.4 dynes/cm. The composition was deposited using an ink-jet device and the deposited precursor was heated to 250° C. to form substantially pure metal traces that were conductive. Thermogravimetric analysis indicated that decomposition was substantially complete at 230° C.

This example illustrates an ink-jettable composition and the use of Pd-trifluoroacetate as a reducing agent for the Ag-trifluoroacetate. This composition has excellent adhesion to KAPTON-HN, silicon and glass substrates.

Example 24

A silver precursor composition was formulated comprising 1.8 grams styrene allyl alcohol, 54.2 grams N-Methyl pyrolidone, 40.5 grams Ag-trifluoroacetate, 2.6 grams lactic acid and 0.9 grams Pd-trifluoroacetate. The composition had a viscosity of 16 centipoise at a shear rate of 66 Hz. The surface tension was 40 dynes/cm. The composition was deposited using an ink-jet device and the deposited precursor was heated to 250° C. to form substantially pure metal traces that were conductive. Thermogravimetric analysis indicates that decomposition is substantially complete at 225° C.

This is an example of an ink-jettable composition and of the use of Pd-trifluoroacetate as a reducing agent for Ag-trifluoroacetate. This example also indicates the wide range of solvents usable for this type of application. This composition has excellent adhesion to KAPTON-HN, silicon and glass.

Example 25

A silver precursor composition was formulated comprising 1.3 grams styrene allyl alcohol, 46.7 grams DMAc, 42.5 grams Ag-trifluoroacetate, 2.6 grams lactic acid and 6.9 grams Pd-trifluoroacetate. This composition had a viscosity of 16.9 centipoise at a shear rate of 66 Hz. The surface tension was 37.8 dynes/cm. The composition was deposited using and ink-jet device and the deposited precursor was heated to 250° C. to form substantially pure metal traces that were conductive. Thermogravimetric analysis indicated that decomposition was substantially complete at 205° C.

This is an example of an ink-jettable composition and of the use of Pd-trifluoroacetate as a reducing agent for Ag-trifluoroacetate. This composition has excellent adhesion to KAPTON-HN, silicon, and glass.

Example 26

A silver precursor and silver nanoparticle precursor composition was formulated comprising 31.6 grams Ag-trifluoroacetate, 31.6 grams water, 30.9 grams ethylene glycol and 5.9 grams silver nanoparticles. The composition had a viscosity of 10 centipoise at a shear rate of 66 Hz and the surface tension was 51 dynes/cm. The composition was deposited using an ink-jet device and heated to 100° C. to produce traces that were conductive and phase pure silver as measured by XRD. The composition was also deposited using an ink-jet device and heated to 200° C. to produce traces that were conductive and were phase pure silver by XRD. Thermogravimetric analysis indicates that conversion was complete by about 185 C. This is an example of a precursor and nanoparticle formulation that can be deposited by an ink-jet and heated at low temperatures to produce phase pure silver on low temperature substrates.

Example 27

A silver precursor composition was formulated comprising 33 grams Ag-trifluoroacetate, 33 grams DMAc, 33 grams diethylene glycol butyl ether (DEGBE), and 3 grams lactic acid. The composition had a viscosity of 10 centipoise at a shear rate of 66 Hz and the surface tension was 63 dynes/cm. This composition was deposited using an ink-jet and heated to 200° C. for 30 minutes. The resulting features were phase pure silver by XRD. Thermogravimetric analysis indicated complete conversion at 210° C. when heated at 10° C./min. This same composition, when deposited and heated at 250° C. for 10 minutes, produced traces that were phase pure silver by XRD, and had a bulk resistivity of not greater than 4 times that of bulk silver. This composition has excellent adhesion to glass, KAPTON-HN, silicon nitrite and silicon.

Example 28

A silver precursor composition was formulated comprising 38.3 grams Ag-Trifluoroacetate, 29.2 grams DMAc, 29.2 grams DEGBE, and 3.4 grams lactic acid. This composition, when deposited and heated to 250° C., produced phase pure silver that was highly conductive. This composition has excellent adhesion to glass, KAPTON-HN, silicon nitrite and silicon.

Example 29

A silver nanoparticle composition was formulated comprising 16.6 grams silver nanoparticles, 41.7 grams water and 41.7 grams ethylene glycol. This composition was deposited using an ink-jet and, when heated to 100° C. on paper and KAPTON-HN, formed conductive traces that were phase pure silver by XRD. This is an example of a purely particle based composition that can be deposited onto low temperature substrates such as mylar, paper and others.

Example 30

A silver nanoparticle composition was formulated comprising 46.7 silver nanoparticles, 17.8 grams water, 17.8 grams Ag-trifluoroacetate and 17.8 grams ethylene glycol. This composition, when deposited and heated, formed phase pure silver by XRD that was highly conductive.

Example 31

A silver nanoparticle composition was formulated comprising 35 grams ethyl alcohol and 65 grams silver nanoparticles. This composition, when heated on a glass slide at 70° C. for 4 hours, produced traces that were conductive, phase pure silver by XRD, and had a bulk resistivity of 100 times that of bulk silver. This composition, when deposited with an ink-jet device, produced traces that were phase pure silver by XRD. This illustrates an example of an ultra low temperature silver composition.

Copper Precursor Compositions

Example 32

Copper formate $xH_2O$ (x~2) was analyzed by thermogravimetric analysis and was shown to undergo full decomposition to copper by about 225° C. in each of forming gas, air and nitrogen. The example in air showed that full decomposition to copper takes place before copper oxides begin to form.

Example 33

Copper formate $x6H_2O$ found to have a solubility in water of about 6% by weight forming a light blue solution. Droplets were deposited onto glass slide. Deposits form copper when processed on hotplate at 200° C. under nitrogen flow gas. Boiling of solvent causes some splattering and drying of solvent causes recrystallization of salt and leads to slow decomposition and formation of disconnected copper deposit. This shows that additives are necessary to increase solubility of copper and decrease volatility of solution to allow for good film formation.

Example 34

Complexing agents for copper formate were added to aqueous solutions. Examples of complexing agents used are ammonium hydroxide, ethanolamine, ethylene diamene, 3-amino-1-propanol, 2-amino-1-butanol, 2-(isopropylamino)ethanol, and triethanolamine. The addition of these complexing agents increased the solubility of copper formate and produced a visible color change. The resulting solutions were made as concentrated as possible and were decomposed from 160° C. to 200° C. on a hotplate under nitrogen flow. The higher vapor pressure complexing agents such as ammonium hydroxide tended to boil and splatter, producing disconnected films with some "halo" of vapor deposition. The lower vapor pressure complexing agents such as 3-amino-1-propanol and 2-amino-1-butanol did not splatter as much and did not vapor deposit copper. All the complexing agents produced copper films. The best complexing agent appeared to be 3-amino-1-propanol as it formed the most continuous copper films that also showed high conductivity.

Example 35

Example 1 from U.S. Pat. No. 5,378,508 by Castro was repeated using copper formate and Duomeen OL (Akzo Nobel, Amersfoort, Netherlands) in a water, acetic acid, and methanol solution to produce a tacky light blue deposit. Instead of decomposing this deposit with a laser as is disclosed by Castro, the material was decomposed on a hotplate at 200° C. under nitrogen flow. The resulting deposit showed some signs of decomposition to copper but was very discontinuous and contained residue from the surfactant.

Example 36

A composition was formulated with 3 wt. % Cu-formate $xH_2O$ (x~2); 3 wt % nickel formate $2H_2O$; 9 wt. % ammonium hydroxide; and 85 wt. % DI water. When decomposed under Nitrogen in TGA gave a Cu—Ni alloy by XRD. This shows that complexing agents and combinations of similar metal precursors work to produce alloys.

Example 37

A 50:50 Cu:Ni precursor composition was prepared using Cu-formate.$xH_2O$ (x~2) and Ni-formate.$2H_2O$ complexed with 3-amino-1-propanol in DI $H_2O$. The precursor composition was decomposed under nitrogen cover/flow gas at 350° C. to produce a metallic looking and conductive deposit. The deposit had a nickel colored sheen and was very porous. The deposit showed to be a Cu—Ni alloy by XRD. This shows that an alloy deposit can be produced by conventional processing.

Example 38

A copper precursor composition was formulated containing equal parts by weight of Cu-formate.$xH_2O$ (x~2), 3-amino-1-propanol and water. The composition was deposited on a glass substrate and rapidly heated to 350° C. The temperature was held at 350° C. for less than 10 seconds, and then rapidly cooled to room temperature. A Scanning Electron Microscope (SEM) photomicrograph showed the film to be dense and x-ray diffraction (XRD) showed that the film contained copper with small amounts of copper oxide. The film had a resistivity of 40 times the bulk resistivity of pure copper metal. This shows that with fast ramp rates, copper deposits can be produced in air.

Example 39

The same precursor composition as in above example was processed at 300° C. with rapid heating and cooling. The conductivity of the resulting film was measured at approximately $3 \times 10^8$ times the bulk copper resistivity while XRD results were identical to Example 33. This shows that kinetics of decomposition are critical to achieving a conductive deposit in air.

Example 40

A precursor composition was formulated including 13 wt. % Cu-formate; 16 wt. % 3-amino-1-propanol; 58 wt. % deionized water; and 20 wt. % ethanol (95%). The precursor composition had a surface tension of 31 dynes/cm and a viscosity of 5 centipoise at a shear rate of 132 Hz. The composition was deposited on ink-jet paper using an ink-jet printer. The precursor composition was rapidly heated in air and cooled and resulted in conductive traces. This shows that a modified precursor composition can be deposited using an ink-jet to produce conductive traces, in air.

Example 41

A precursor composition including 30 weight percent Cu-formate.$xH_2O$ (x~2), 40 weight percent 3-amino-1-propanol and 30 weight percent water was deposited and processed on glass, FR-4, and Kapton at 200° C. under a nitrogen atmosphere. The resulting films when scraped with a razor blade rolled up, behaving much like a foil. The films were dense and had an average resistivity of 10 times the resistivity of bulk copper. This example demonstrates that conductive copper features can be formed by processing the precursor compositions under an inert gas, such as nitrogen.

Example 42

The above precursor composition was deposited with a quill pen onto FR-4 and glass. Conductive traces could be made when lines were processed under nitrogen at 200° C. In certain thin areas solvent evaporation took place before decomposition occurred. In theses cases recrystallization of the copper formate took place and the film was discontinuous.

Large drops of precursor composition were also deposited and dried. In one instance a deposit was dried at 90° C. for 40 minutes leading to partial drying and some crystallization. Upon decomposition at 200° C., however, crystals redissolved and decomposition to copper was complete. When a drop was dried further until no remaining solvent was apparent and crystals changed from dark blue to light blue-green before processing, the resulting deposit took longer (few minutes) to fully convert to copper and resulted in a porous, discontinuous and mechanically weak deposit.

This shows that presence of the complexing agent and solvent is necessary for proper film formation and conversion to a dense film. Therefore, precursor composition should not be dried before processing and decomposition kinetics need to be fairly rapid in order that decomposition takes place faster than drying.

Example 43

The precursor composition of Example 42 was deposited on glass, FR-4, and KAPTON and processed at 180° C. and at 150° C. under nitrogen. The resulting films averaged 47 times the bulk copper resistivity and 390 times the bulk copper resistivity, respectively.

Example 44

A composition was formulated with 27 wt. % Cu formate $xH_2O$ (x~2); 27 wt. % DI water; 32 wt. % 3-amino-1-propanol; and 14 wt. % dimethyacetamide. Drops were decomposed on glass under nitrogen flow at 200° C. on a hot plate. Bulk resistivity measurements yielded 10× bulk copper on average. The solution was modified with an addition of tetraamine palladium hydroxide. Samples of both the solution with and without the palladium precursor addition were decomposed on a hotplate in air at 200° C. The sample without the addition did form copper by XRD with indication of copper oxides as well, but the deposit was dark with residue and did not appear to be completely decomposed. The sample with the tetraamine palladium hydroxide addition decomposed in a few seconds to a coppery looking conductive deposit which showed to have no oxide present in a short XRD scan and no separate Pd peaks. The ratio of Cu to Pd was about 2% Pd by weight. This shows that an additional metal precursor may act as a catalyst for decomposition while also forming an alloy.

Electrocatalysts

The following examples illustrate low viscosity compositions for the deposition of PEM MEA electrodes.

Example 45

1 gram of a 20 wt. % platinum on carbon (Pt/C) electrocatalyst, where the carbon support is an acetylene carbon (SHAWINIGAN BLACK, available from Chevron Chemical Company, Houston, Tex.), was dispersed in 2 ml of de-ionized water and 10 ml of a 5% solution of a sulfonated perfluorohydrocarbon polymer (NAFION, available from E.I. duPont deNemours, Wilmington, Del.) to yield final composition after drying of the solvent of 67 wt. % catalyst and 33 wt. % NAFION. The composition was sonicated in a water bath for at least 10 min. The particle size distribution for this composition is a $d_{10}$ of 1.9 µm, a $d_{50}$ of 4.7 µm and a $d_{95}$ of 16.0 µm. The viscosity was measured to be 10 centipoise in the range of 5 to 50 rpm.

Example 46

1 gram of 60 wt. % Pt/C electrocatalyst, where the carbon support is a high surface area carbon (KETJENBLACK, available from Akzo Nobel, Amersfoort, Netherlands), was dispersed in 2 ml of de-ionized water and 10 ml of 5 wt. % NAFION solution to yield a final composition after drying the solvent of 60 wt. % catalyst and 40 wt. % NAFION. The composition was sonicated in a water bath for at least 10 min. The particle size distribution for this composition is a $d_{10}$ of 3 µm, a $d_{50}$ of 6 µm and a $d_{95}$ of 14 µm.

The following examples illustrate ink-jettable compositions that are useful for the fabrication of DMFC (direct methanol fuel cell) electrodes.

Example 47

1 gram of 60 wt. % precious metals (Pt, PtRu) on carbon electrocatalysts, where the carbon support is KETJENBLACK, was dispersed in 6 grams de-ionized water and NAFION solution (5% by weight) to have a final weight ratio of 85:15 of dry catalyst to NAFION in the final electrode structure. The composition was then mildly sonicated using a bath. The particle size distribution for this composition was a $d_{10}$ of 3.4 µm, a $d_{50}$ of 6.5 µm and a $d_{95}$ of 16.8 µm. Viscosity was measured to be 23 centipoise at 5 rpm and 92 centipoise at 50 rpm. The composition had a surface tension of 30 mN/m.

Example 48

1 gram of porous, micron-sized pure Pt particles prepared by a spray conversion method was dispersed in 10 gram de-ionized water by sonication using an ultrasonic horn. A NAFION solution (5% by weight) was then added to have a final weight ratio of 90:10 of dry catalyst to NAFION in the final electrode structure. The viscosity of this ink was about 7 to 10 centipoise with a surface tension of 30 mN/m. The particle size distribution for this ink was a $d_{10}$ of 1 µm, a $d_{50}$ of 3.2 µm and a $d_{95}$ of 10.6 µm.

Example 49

1 gram of Pt blacks was dispersed in 10 grams de-ionized water by sonication using an ultrasonic horn. A NAFION solution (5% by weight) was then added to have a final weight ratio of 90:10 of dry catalyst to NAFION in the final electrode structure. The particle size distribution for this ink was a $d_{10}$ of 1 µm, a $d_{50}$ of 5 µm and a $d_{95}$ of 20 µm.

Example 50

As is discussed above, preferred precursors for platinum metal according to the present invention include chloroplatinic acid ($H_2PtCl_6 \cdot xH_2O$), tetraamineplatinum (II) nitrate ($Pt(NH_3)_4(NO_3)_2$), tetraamineplatinum (II) hydroxide ($Pt(NH_3)_4(OH)_2$), tetraamineplatinum (II) bis(bicarbonate) ($Pt(NH_3)_4(HCO_3)_2$), platinum nitrate ($Pt(NO_3)_2$), hexa-hydroxyplatinic acid ($H_2Pt(OH)_6$), platinum (II) 2,4-pentanedionate ($Pt(acac)_2$), and platinum (II) 1,1,1,5,5,5-hexafluoro 2,4-pentanedionate ($Pt(hfac)_2$). Other platinum precursors include Pt-nitrates, Pt-amine nitrates, Pt-hydroxides, Pt-carboxylates, $Na_2PtCl_4$, and the like.

The Pt precursor is dissolved in either water or organic based solvent up to 30 wt. % concentration. A portion of appropriate solvent (water or organic based) is slowly added to a carbon dispersion similar to GRAFO 1300 (Fuchs Lubricant, Harvey, Ill.), while being shear mixed to achieve up to 30 wt. % solids loading dispersion. A solution of Pt precursor is then slowly added to the shearing carbon dispersion. The resulting composition is then shear mixed for an additional 10 minutes. The viscosity for a 5 wt. % solids loading dispersion was measured to be 3 to 4 centipoise with surface tension of 77 mN/m.

Example 51

A TEFLON coated KAPTON substrate was selectively coated with a removable protective coating exposing a 100 µm wide trench of the underlying TEFLON coating. This substrate was dipped into an etchant (TETRA-ETCH, available from W.L. Gore and Associates) that forms a hydrophilic surface, followed by a rinse in water and removal of the adhesive protective coating. This resulted in a hydrophobic surface (natural surface of TEFLON) with a 100 µm wide hydrophilic strip from the etchant. The substrate was subsequently drop coated with a silver precursor composition containing 33 grams Ag-trifluoroacetate, 33 grams $H_2O$, 33 grams DEGBE and 1 gram lactic acid. The composition was observed to be confined to the hydrophilic surface strip. After heating of the confined composition to 200° C. for 5 minutes, a 100 µm wide silver line was obtained with a bulk resistivity of about 3 times the bulk resistivity of pure solid silver.

This example demonstrates the ability to confine a low viscosity precursor composition through surface modification of the substrate.

Example 52

A precursor composition was formulated by combining 0.24 grams palladium trifluoroacetate, 7.3 grams silver trifluoroacetate, 37.5 grams silver flake, 5.13 grams terpineol, 1.55 grams N-methyl-pyrolidone. This mixture was fired at 185° C. for 60 minutes to yield a resistivity of 2.3 times the bulk resistivity of pure silver.

Example 53

A precursor composition was formulated by combining 35 grams silver flake, 7.55 grams silver (I) oxide and 5.35 grams terpineol. This mixture was fired at 185° C. for 60 minutes to yield a resistivity of 2.4 times the bulk resistivity of pure silver.

Example 54

A precursor composition was formulated by combining 35.03 grams silver flake, 6.26 grams silver nitrite, 6.51 grams terpineol. This mixture was fired at 185° C. for 60 minutes to yield a resistivity of 2.1 times the bulk resistivity of pure silver.

Example 55

A precursor composition was formulated including 16.5 grams metallic silver powder, 3.5 grams alpha-terpineol and 5 grams silver carbonate. This composition was deposited and heated to 350° C. The resulting conductive trace had a resistivity of 29 times the bulk resistivity of pure silver.

Example 56

A precursor composition was formulated including 10 grams silver oxide, 0.9 grams silver nitrate, 20 grams metallic silver powder, 2.1 grams DMAc and 5.0 grams terpineol. The composition was deposited and heated to 350° C. The resulting conductive trace had a resistivity of about 11 times the bulk resistivity of silver.

Examples of In-Situ Precursor Generation

Example 57

Comparative Example

Silver oxide (AgO) powder was tested using TGA at a constant heating rate of 10° C./min. The TGA showed the conversion to pure silver was complete by about 460° C.

Example 58

A mixture of 3.2 grams silver oxide and 3.0 grams neodecanoic acid was analyzed in a TGA. The analysis demonstrated that the conversion to pure silver was substantially complete by about 250° C.

Example 59

A mixture of 5.2 grams alpha terpineol, 4.9 grams silver oxide and 1.1 grams neodecanoic acid was analyzed in a TGA. The TGA demonstrated that the conversion to pure silver was substantially complete by about 220° C.

Example 60

The silver oxide/carboxylic acid chemistry was modified by the addition of metallic silver powder. The reaction products from the silver oxide and carboxylic acid weld the silver particles together providing highly conductive silver traces and features.

Example 61

A precursor composition was formulated that included 102.9 grams silver metal powder, 7.8 grams silver oxide, 15.2 grams silver nitrate, 10.1 grams terpineol and 1.5 grams SOL-SPERSE 21000. The precursor composition was deposited and was heated to 250° C. The resulting conductive features had a resistivity that was less than 6 times the bulk resistivity of pure silver. The material was very dense and had low porosity. This mixture was analyzed in a TGA and showed a conversion to silver at about 270° C.

While various embodiments of the present invention have been described in detail, it is apparent that modifications and adaptations of those embodiments will occur to those skilled in the art. However, it is to be expressly understood that such modifications and adaptations are within the spirit and scope of the present invention.

The invention claimed is:

1. A process for forming a photovoltaic conductive feature, comprising:
    (a) roll printing a precursor composition onto a substrate, wherein the precursor composition comprises at least one of metallic nanoparticles comprising a metal or a metal precursor compound to the metal; and
    (b) heating the precursor composition to a temperature not greater than 300° C. to form the photovoltaic conductive feature on the substrate, wherein the conductivity of the photovoltaic conductive feature is no less than 10 percent the conductivity of the equivalent pure metal.

* * * * *